(12) United States Patent
Yeon et al.

(10) Patent No.: US 12,119,332 B2
(45) Date of Patent: Oct. 15, 2024

(54) TILED DISPLAY

(71) Applicant: Samsung Display Co., LTD., Yongin-si (KR)

(72) Inventors: Eun Kyung Yeon, Suwon-si (KR); Yi Joon Ahn, Seoul (KR); Sung Hoon Kim, Asan-si (KR); Jae Been Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 173 days.

(21) Appl. No.: 17/383,026

(22) Filed: Jul. 22, 2021

(65) Prior Publication Data

US 2022/0037296 A1 Feb. 3, 2022

(30) Foreign Application Priority Data

Jul. 31, 2020 (KR) .................. 10-2020-0095889

(51) Int. Cl.
*H01L 25/16* (2023.01)

(52) U.S. Cl.
CPC .......... *H01L 25/162* (2013.01); *H01L 25/167* (2013.01)

(58) Field of Classification Search
None
See application file for complete search history.

(56) References Cited

U.S. PATENT DOCUMENTS

| 6,249,329 B1 * | 6/2001 | Dabral | G02F 1/1339 349/73 |
| 10,546,913 B2 | 1/2020 | Lee et al. | |
| 2010/0283803 A1 * | 11/2010 | Chou | G02F 1/133514 345/690 |
| 2020/0381586 A1 * | 12/2020 | Yu | H01L 33/20 |

FOREIGN PATENT DOCUMENTS

| KR | 10-2016-0084791 | 7/2016 |
| KR | 10-2021-0117380 | 9/2021 |

* cited by examiner

*Primary Examiner* — Erik T. K. Peterson
*Assistant Examiner* — Christopher A. Schodde
(74) *Attorney, Agent, or Firm* — KILE PARK REED & HOUTTEMAN PLLC

(57) ABSTRACT

A tiled display comprises display devices adjacent to one another and each comprising first pixels and second pixels, a first boundary area where longer sides of at least two of the display devices are adjacent to each other, and a second boundary area where shorter sides of at least two of the display devices are adjacent to each other. Each of the first pixels and the second pixels comprises sub-pixels. The first pixels are disposed in the first boundary area such that the sub-pixels of the first pixels are parallel to the longer sides of the display devices. The second pixels are disposed in the second boundary area such that the sub-pixels of the second pixels are parallel to the shorter sides of the display devices.

20 Claims, 21 Drawing Sheets

TILED DISPLAY

CROSS-REFERENCE TO RELATED APPLICATION(S)

This application claims priority to and benefits of Korean Patent Application No. 10-2020-0095889 under 35 U.S.C. § 119, filed in the Korean Intellectual Property Office on Jul. 31, 2020, the entire contents of which are herein incorporated by reference.

BACKGROUND

1. Technical Field

The disclosure relates to a tiled display.

2. Description of the Related Art

As information-oriented society evolves, various demands for display devices are ever increasing. For example, display devices may be used by a variety of electronic devices such as smart phones, digital cameras, laptop computers, navigation devices, and smart televisions. Display devices may be flat panel display devices such as a liquid-crystal display device, a field emission display device, and an organic light-emitting display device. Among such flat panel display devices, a light-emitting display device may include a light-emitting element so that each of the pixels of the display panel can emit light by themselves. Accordingly, a light-emitting display device can display images without a backlight unit that supplies light to the display panel.

For a display device having a large screen, a large number of pixels may be disposed, and thus the defect rate of light-emitting elements may increase while productivity or reliability may deteriorate. To overcome such issues, a tiled display can provide a large screen by connecting multiple display devices having a relatively small size. A tiled display may include marginal areas in the pixels where multiple display devices may be arranged adjacent to each other. Such a marginal area may refer to an area of a single pixel where the light-emitting areas of the sub-pixels may not be disposed. For a display device having a high resolution, the size of the pixels may be small while the size of the light-emitting areas of the sub-pixels may still be the same. Thus, the size of the marginal areas may be reduced.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure may provide a tile display that can have a high resolution as well as a sufficient marginal area in each pixel so that multiple display devices can be attached to each other.

It should be noted that aspects of the disclosure are not limited to the above-mentioned aspect. Other aspects of the disclosure will be apparent to those skilled in the art from the following descriptions.

According to an embodiment of the disclosure, margins for processes of attaching and cutting display devices of a tiled display can be obtained by way of arranging sub-pixels differently for different pixels in boundary areas where the display devices may be adjacent to each other.

According to an embodiment of the disclosure, a high-resolution tiled display can be implemented by way of obtaining margins for processes of attaching and cutting display devices in the boundary areas.

It should be noted that effects of the disclosure are not limited to those described above and other effects of the disclosure will be apparent to those skilled in the art from the following descriptions.

According to an embodiment of the disclosure, a tiled display may include a plurality of display devices adjacent to one another and each comprising first pixels and second pixels, a first boundary area where longer sides of at least two of the plurality of display devices may be adjacent to each other, and a second boundary area where shorter sides of at least two of the plurality of display devices may be adjacent to each other, wherein each of the first pixels and the second pixels comprises sub-pixels, the first pixels may be disposed in the first boundary area such that the sub-pixels of the first pixels may be parallel to the longer sides of the plurality of display devices, and the second pixels may be disposed in the second boundary area such that the sub-pixels of the second pixels may be parallel to the shorter sides of the plurality of display devices.

In an embodiment, the sub-pixels of a first pixel may be adjacent to a corner of the first pixel where a first side of the first pixel and a second side of the first pixel meet, and the first side may be parallel to the longer sides of the plurality of display devices and the second side may be parallel to the shorter sides of the plurality of display devices.

In an embodiment, the sub-pixels of a second pixel may be adjacent to a corner of the second pixel where a first side of the second pixel and a second side of the second pixel meet, and the first side may be parallel to the longer sides of the plurality of display devices and the second side may be parallel to the shorter sides of the plurality of display devices.

In an embodiment, the sub-pixels of each of the first pixels and the second pixels may comprise a first sub-pixel, a second sub-pixel, and a third sub-pixel, and the third sub-pixel may be closer to the corner of the first pixel or the corner of the second pixel than the first sub-pixel and the second sub-pixel.

In an embodiment, the third sub-pixel of each of the first pixels and the second pixels may emit green light and may be disposed at a same location in each of the first pixels and the second pixels.

In an embodiment, the sub-pixels of each of the first pixels may be spaced apart from a longer side of an adjacent one of the plurality of display devices by a first distance.

In an embodiment, the sub-pixels of each of the second pixels may be spaced apart from a shorter side of another adjacent one of the plurality of display devices by a second distance.

In an embodiment, the tiled display may further comprise a third boundary area where corners of the plurality of display devices meet, wherein the third boundary area may comprise a third pixel, a fourth pixel and a fifth pixel disposed adjacent to one another, and each of the third pixel, the fourth pixel and the fifth pixel may comprise at least one of the first sub-pixel, the second sub-pixel and the third sub-pixel.

In an embodiment, third pixel may comprise the third sub-pixel that emits green light, the third sub-pixel may be disposed adjacent to a corner of the third pixel where a first side of the third pixel and a second side of the third pixel meet, and the first side may be parallel to the longer sides of the plurality of display devices and the second may be parallel to the shorter sides of the plurality of display devices.

In an embodiment, the third sub-pixel of the third pixel may be spaced apart from a longer side of an adjacent one of the plurality of display devices by a first distance, and may be spaced apart from a shorter side of another adjacent one of the plurality of display devices by a second distance.

In an embodiment, the fourth pixel may be disposed adjacent to the third pixel parallel to the longer sides of the plurality of display devices, and may comprise a plurality of sub-pixels arranged in a direction parallel to the longer sides of the display devices from the third sub-pixel of the third pixel, the plurality of sub-pixels may comprise the first sub-pixel, the second sub-pixel, the third sub-pixel and a fourth sub-pixel, and the fourth sub-pixel and one of the first sub-pixel, the second sub-pixel, and the third sub-pixel may emit light of a same color.

In an embodiment, the fourth sub-pixel of the fourth pixel may be adjacent to the third sub-pixel of the third pixel, and may emit light of a different color from a color of the third sub-pixel of the third pixel.

In an embodiment, the fifth pixel may be disposed adjacent to the third pixel parallel to the shorter sides of the plurality of display devices, and may comprise a plurality of sub-pixels arranged in a direction parallel to the plurality of shorter sides of the display devices extending from the third sub-pixel of the third pixel, the plurality of sub-pixels may comprise the first sub-pixel, the second sub-pixel, the third sub-pixel and a fifth sub-pixel, and the fifth sub-pixel and one of the first sub-pixel, the second sub-pixel and the third sub-pixel may emit light of a same color.

In an embodiment, the fifth sub-pixel of the fifth pixel may be adjacent to the third sub-pixel of the third pixel and may emit light of a different color from a color of the third sub-pixel of the third pixel, the fifth sub-pixel may emit light of one of the colors of the lights emitted from the first sub-pixel, the second sub-pixel, and the third sub-pixel, and the light of the fifth sub-pixel may have a color different from the colors of the lights emitted from the third sub-pixel of the third pixel and the fourth sub-pixel.

In an embodiment, the third sub-pixel of each of the third pixel, the fourth pixel and the fifth pixel may be disposed at a same location in each of the third pixel, the fourth pixel, and the fifth pixel.

According to an embodiment of the disclosure, the tiled display may include a plurality of display devices each comprising first pixels and second pixels, a first boundary area where longer sides of at least two of the plurality of display devices may be adjacent to each other, a second boundary area where shorter sides of at least two of the plurality of display devices may be adjacent to each other, and a third boundary area where corners of the plurality of display devices may be adjacent to each other, wherein one of the plurality of display devices may comprise a third pixel, a fourth pixel and a fifth pixel overlapping the third boundary area and adjacent to each other, each of the third pixel, the fourth pixel and the fifth pixel may comprise at least one of a first sub-pixel, a second sub-pixel, and a third sub-pixel, the third pixel may comprise the third sub-pixel, the third sub-pixel may be disposed adjacent to a corner of the third pixel where a first side of the third pixel and a second side of the third pixel meet, the first side may be parallel to the longer sides of the plurality of display devices and the second side may be parallel to the shorter sides of the plurality of display devices, at least one of the sub-pixels of the fourth pixel may be arranged parallel to the longer sides of the plurality of display devices from the third sub-pixel of the third pixel, and at least one of the sub-pixels of the fifth pixel may be arranged parallel to the shorter sides of the display devices from the third sub-pixel of the third pixel.

In an embodiment, the at least one sub-pixel of the fourth pixel may comprise the first sub-pixel, the second sub-pixel, the third sub-pixel, and a fourth sub-pixel, the fourth sub-pixel and one of the first sub-pixel, the second sub-pixel, and the third sub-pixel may emit light of a same color, and the fourth sub-pixel may emit light of a different color from a color of the third sub-pixel of the third pixel.

In an embodiment, the at least one sub-pixel of the fifth pixel may comprise the first sub-pixel, the second sub-pixel, the third sub-pixel, and a fifth sub-pixel, and the fifth sub-pixel may emit light and one of the first sub-pixel, the second sub-pixel, and the third sub-pixel may emit light of a same color, and the fifth sub-pixel may emit light of a different color from a color of the third sub-pixel and a color of the fourth sub-pixel of the third pixel.

In an embodiment, the first pixels may be disposed in the first boundary area, the second pixels may be disposed in the second boundary area, each of the first and second pixels may comprise the first sub-pixel, the second sub-pixel and the third sub-pixel, the third sub-pixel of a first pixel may be disposed adjacent to a corner of the first pixel where a first side of the first pixel and a second side of the first pixel meet, the first side of the first pixel may be parallel to the longer sides of the plurality of display devices and the second side of the first pixel may be parallel to the shorter sides of the plurality of display devices, the third sub-pixel of a second pixel may be disposed adjacent to a corner of the second pixel where a first side of the second pixel and a second side of the second pixel meet, and the first side of the second pixel may be parallel to the longer sides of the plurality of display devices and the second side of the second pixel may be parallel to the shorter sides of the plurality of display devices.

In an embodiment, the third sub-pixel of each of the first pixel, the second pixel, the third pixel, the fourth pixel, and the fifth pixel may be disposed at a same location in each of the first pixel, the second pixel, the third pixel, the fourth pixel, and the fifth pixel.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
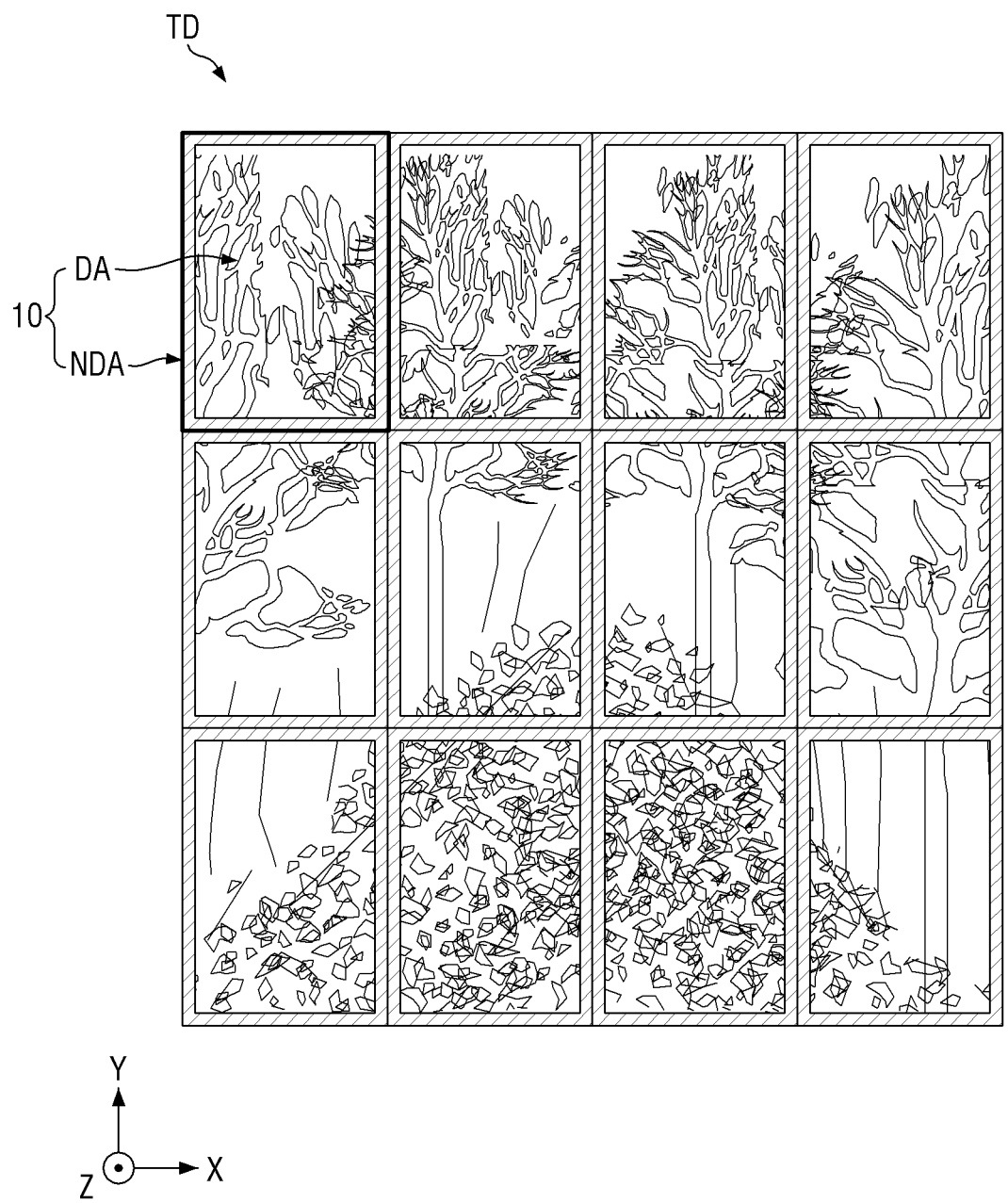
FIG. 1 is a schematic plan view showing a tiled display according to an embodiment of the disclosure.

The disclosure will now be described more fully hereinafter with reference to the accompanying drawings, in which embodiments are shown. Concepts of the disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

References to singular elements (e.g., "a", "an", "the") may include plural forms, unless the context clearly dictates otherwise. The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." The phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

It will be further understood that the terms "comprise", "include", "have", etc. when used herein, specify the presence of stated elements, but do not preclude the presence or addition of one or more other elements.

The term "overlap" may include layer, stack, face or facing, extending over, extending under, covering or partly covering or any other suitable term as would be appreciated and understood by those of ordinary skill in the art.

Each of the features of the various embodiments of the disclosure may be combined, in part or in whole, and technically various interlocking and driving relationships are possible. Each embodiment may be implemented independently of each other or may be implemented together in an association.

"About", "approximately", "substantially", and the like, as used herein are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic plan view showing a tiled display according to an embodiment of the disclosure.

Referring to FIG. 1, a tiled display TD may include multiple display devices 10. The display devices 10 may be arranged in, but are not limited to, a lattice pattern. The display devices 10 may be extended in a first direction (x-axis direction) or a second direction (y-axis direction), and the tiled display TD may have a certain shape. For example, the display devices 10 may all have the same size. It is, however, to be understood that the disclosure is not limited thereto. As another example, the display devices 10 may have different sizes.

Each of the display devices 10 may have a rectangular shape including longer sides and shorter sides. The display devices 10 may be arranged such that the longer sides or the shorter sides of the display devices 10 may be extended to one another. Some of the display devices 10 may be disposed on an edge of the tiled display TD to form one side of the tiled display TD. Some others of the display devices 10 may be disposed at a corner of the tiled display TD, and may form two adjacent sides of the tiled display TD. Still some others of the display devices 10 may be disposed on the inner side of the tiled display TD and may be surrounded by the other display devices 10.

Each of the display devices 10 may include a display area DA and a non-display area NDA. The display area DA may include pixels to display images. The non-display area NDA may be disposed adjacent to the display area DA to surround the display area DA, and may not display an image.

The tiled display TD may have, but is not limited to, a generally planar shape. The tiled display TD may have a three-dimensional shape, giving a viewer a three-dimensional experience. For example, in case that the tiled display TD has a three-dimensional shape, at least some of the display devices 10 may have a curved shape. As another example, the display devices 10 may have a flat shape and may be physically connected with one another at an angle, so that the tiled display TD may have a three-dimensional shape.

The tiled display device TD may be formed by extending non-display areas NDA of the adjacent display devices 10 to one another. The display devices 10 may be physically connected with one another through a bonding member or an adhesive member. Accordingly, the non-display area NDA between the display devices 10 may be surrounded by adjacent display areas DA. The display areas DA of the display devices 10 may be so close to one another that a viewer cannot recognize the non-display areas NDA between the display devices 10 (e.g., the boundaries between the display devices 10). The reflectivity of external light at the display areas DA of the display devices 10 may be substantially equal to the reflectivity of external light at the non-display areas NDA between the display devices 10. Accordingly, the tiled display TD can allow a viewer to get immersed into the images by eliminating seams between the display devices 10 by way of preventing the non-display areas NDA (e.g., boundaries between the display devices 10) from being perceived.

Figure 2:
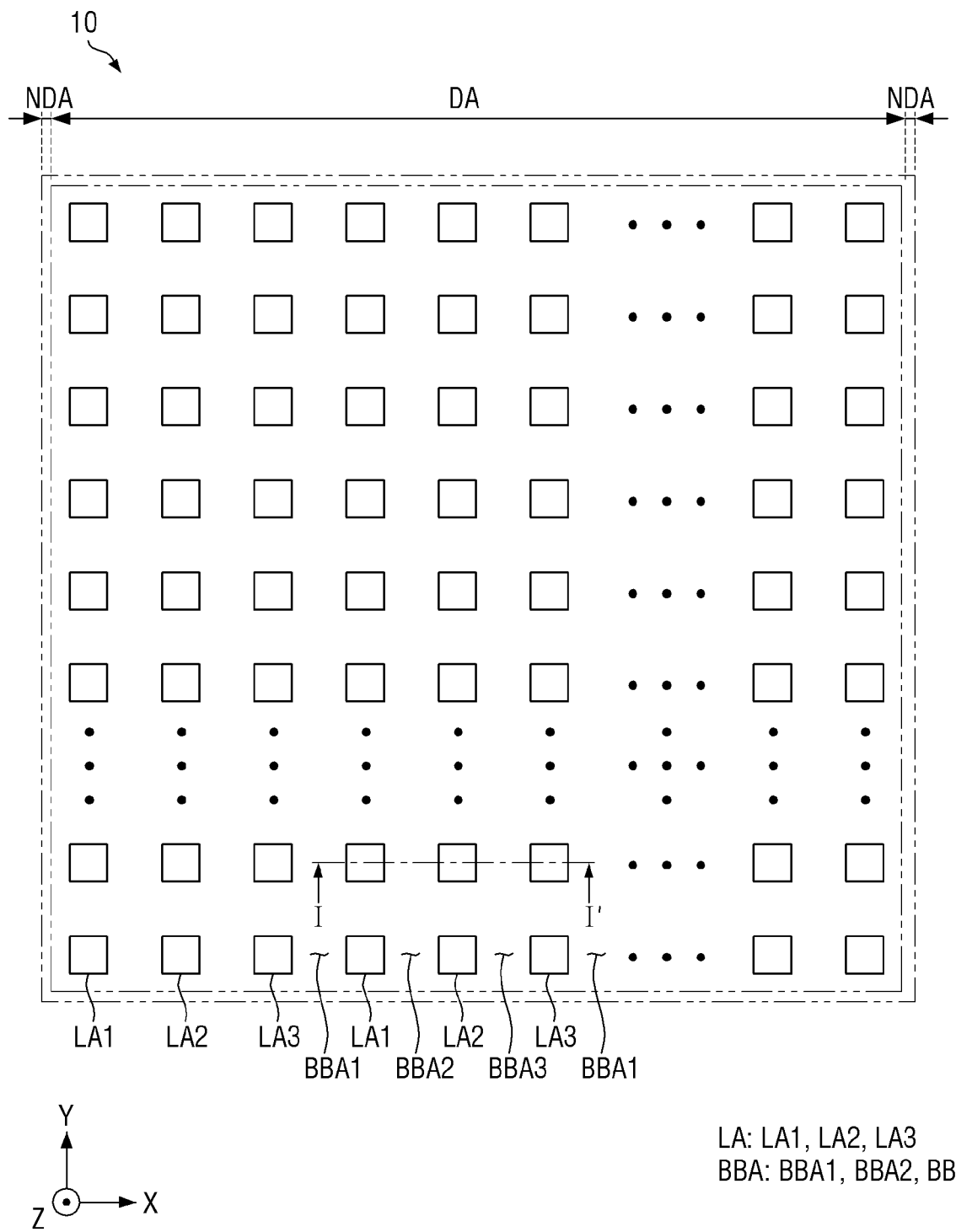
FIG. 2 is a schematic plan view showing a display device according to an embodiment of the disclosure.

FIG. 2 is a schematic plan view showing a display device according to an embodiment of the disclosure.

Referring to FIG. 2, the display device 10 may include pixels arranged of rows and columns in the display area DA. Each of the pixels may include a light-emitting area LA defined by a pixel defining layer, and may emit light having a peak wavelength through the light-emitting area LA. For example, the display area DA of each of the display devices 10 may include first to third light-emitting areas LA1, LA2, and LA3. In each of the first to third light-emitting areas LA1, LA2 and LA3, light generated by a light-emitting element of the display device 10 may exit out of the display device 10.

The first to third light-emitting areas LA1, LA2, and LA3 may emit light having a peak wavelength to the outside of the display device 10. The first light-emitting area LA1 may emit light of a first color, the second light-emitting area LA2 may emit light of a second color, and the third light-emitting area LA3 may emit light of a third color. For example, the light of the first color may be red light having a peak wavelength in the range of about 610 to about 650 nm, the light of the second color may be green light having a peak wavelength in the range of about 510 to about 550 nm, and the light of the third color may be blue light having a peak wavelength in the range of about 440 to about 480 nm. It is, however, to be understood that the disclosure is not limited thereto.

The first to third light-emitting areas LA1, LA2, and LA3 may be arranged repeatedly and sequentially along the first direction (X-axis direction) of the display area DA. For example, the width of the first light-emitting area LA1 in the first direction (X-axis direction) may be larger than the width of the second light-emitting area LA2 in the first direction. The width of the second light-emitting area LA2 in the first direction may be larger than the width of the third light-emitting area LA3 in the first direction. As another example, the width of the first light-emitting area LA1 in the first direction (X-axis direction), the width of the second light-emitting area LA2 in the first direction, and the width of the third light-emitting area LA3 in the first direction may be substantially all equal.

For example, the area of the first light-emitting area LA1 may be larger than the area of the second light-emitting area LA2, and the area of the second light-emitting area LA2 may be larger than the area of the third light-emitting area LA3. As another example, the area of the first light-emitting area LA1, the area of the second light-emitting area LA2 and the area of the third light-emitting area LA3 may be substantially all equal.

The display area DA of the display device 10 may include light-blocking areas BBA surrounding the light-emitting areas LA. For example, the display area DA may include first to third light-blocking areas BBA1, BBA2, and BBA3. The first to third light-blocking areas BBA1, BBA2 and BBA3 may be disposed on a side of the first to third light-emitting areas LA1, LA2 and LA3, respectively, thereby preventing mixture of the lights emitted from the first to third light-emitting areas LA1, LA2 and LA3.

Figure 3:
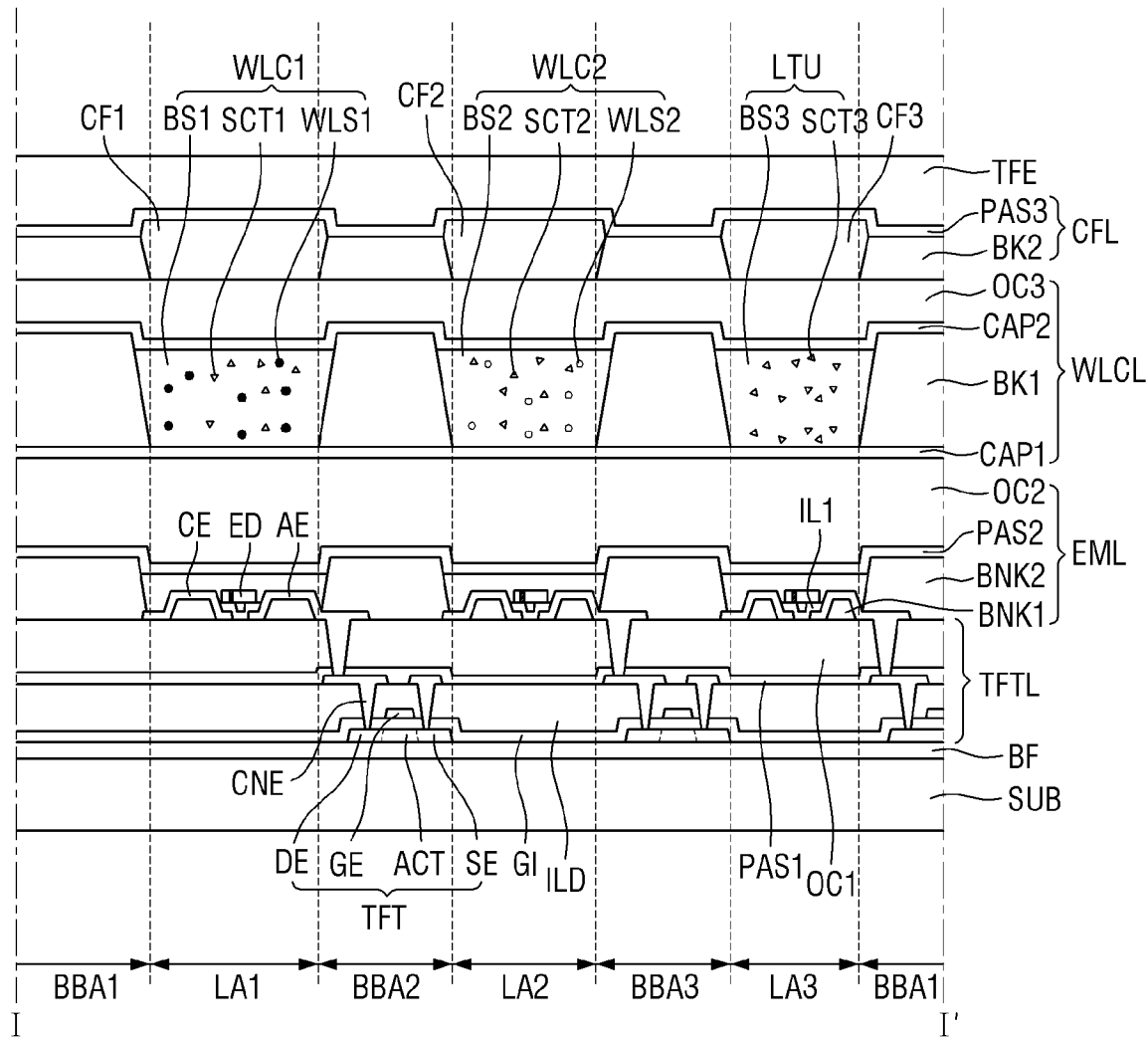
FIG. 3 is a schematic cross-sectional view, taken along line I-I' of FIG. 2.

FIG. 3 is a schematic cross-sectional view, taken along line I-I' of FIG. 2.

Referring to FIG. 3, the display area DA of each of the display devices 10 may include first to third light-emitting areas LA1, LA2, and LA3. In the first to third light-emitting areas LA1, LA2 and LA3, light generated by light-emitting diodes ED of the display device 10 may exit out of the display device 10.

The display device 10 may include a substrate SUB, a buffer layer BF, a thin-film transistor layer TFTL, an emission element layer EML, a wavelength conversion layer WLCL, a color filter layer CFL, and an encapsulation layer TFE.

The substrate SUB may be a base substrate or a base member and may be made of an insulating material such as a polymer resin. For example, the substrate SUB may be a flexible substrate that can be bent, folded, or rolled. The substrate SUB may include, but is not limited to, polyimide (PI).

The buffer layer BF may be disposed on the substrate SUB. The buffer layer BF may be formed of an inorganic layer that can prevent the permeation of air or moisture. For example, the buffer layer BF may include inorganic layers stacked on one another alternately.

The thin-film transistor layer TFTL may include a thin-film transistor TFT, a gate insulator GI, an interlayer dielectric layer ILD, a connection electrode CNE, a first passivation layer PAS1, and a first planarization layer OC1.

The thin-film transistor TFT may be disposed on the buffer layer BF, and may form a pixel circuit of each of multiple pixels. For example, the thin-film transistor TFT may be a driving transistor or a switching transistor of the pixel circuit. The thin-film transistor TFT may include a semiconductor region ACT, a gate electrode GE, a source electrode SE, and a drain electrode DE.

The semiconductor region ACT, the source electrode SE and the drain electrode DE may be disposed on the buffer layer BF. The semiconductor region ACT may overlap the gate electrode GE in a thickness direction and may be insulated from the gate electrode GE by the gate insulator GI. The source electrode SE and the drain electrode DE may be formed by converting the material of the semiconductor region ACT into a conductor.

The gate electrode GE may be disposed on the gate insulator GI. The gate electrode GE may overlap the semiconductor region ACT with the gate insulator GI interposed therebetween.

The gate insulator GI may be disposed on the semiconductor region ACT, the source electrode SE and the drain electrode DE. For example, the gate insulator GI may cover the semiconductor region ACT, the source electrode SE, the drain electrode DE and the buffer layer BF, and may insulate the semiconductor region ACT from the gate electrode GE. The gate insulator GI may include contact holes through which the connection electrodes CNE pass.

The interlayer dielectric layer ILD may be disposed over the gate electrode GE. For example, the interlayer dielectric layer ILD may include contact holes through which the connection electrodes CNE pass. The contact holes of the interlayer dielectric layer ILD may be extended to the contact holes of the gate insulator GI.

The connection electrodes CNE may be disposed on the interlayer dielectric layer ILD. The connection electrode CNE may connect the drain electrode DE of the thin-film transistor TFT with a first electrode AE of the light-emitting element EL. The connection electrode CNE may come in contact with the drain electrode DE through the contact hole formed in the gate insulator GI and the interlayer dielectric layer ILD.

The first passivation layer PAS1 may be disposed over the connection electrode CNE to protect the thin-film transistor TFT. For example, the first passivation layer PAS1 may include a contact hole through which the first electrode AE of the light-emitting element EL passes.

The first planarization layer OC1 may be disposed on the first passivation layer PAS1 to provide a flat surface over the thin-film transistor layer TFTL. For example, the first planarization layer OC1 may include a contact hole through which the first electrode AE of the light-emitting element EL passes. The contact hole in the first planarization layer OC1 may be extended to the contact hole in the first passivation layer PAS1.

The emission element layer EML may include a light-emitting element EL, a first bank BNK1, a second bank BNK2, a second passivation layer PAS2, and a second planarization layer OC2.

The light-emitting element EL may be disposed on the thin-film transistor TFT. The light-emitting element EL may include a first electrode AE, a second electrode CE, and a light-emitting diode ED.

The first electrode AE may be disposed on the first planarization layer OC1. For example, the first electrode AE may be disposed on the first bank BNK1 disposed on the first planarization layer OC1 to cover the first bank BNK1. The first electrode AE may be disposed to overlap one of the first to third light-emitting areas LA1, LA2 and LA3 defined by the second bank BNK2. The first electrode AE may be electrically connected to the drain electrode DE of the thin-film transistor TFT. The first electrode AE may be, but is not limited to, an anode electrode of the light-emitting element EL.

The second electrode CE may be disposed on the first planarization layer OC1 such that it may be spaced apart from the first electrode AE. For example, the second electrode CE may be disposed on the first bank BNK1 disposed on the first planarization layer OC1 to cover the first bank BNK1. The second electrode CE may be disposed to overlap one of the first to third light-emitting areas LA1, LA2 and LA3 defined by the second bank BNK2. For example, the second electrode CE may receive a common voltage applied to all pixels. The second electrode CE may be, but is not limited to, a cathode electrode of the light-emitting element EL.

The first insulating layer IL1 may cover a portion of the first electrode AE and a portion of the second electrode CE adjacent to each other and may insulate the first and second electrodes AE and CE from each other.

The light-emitting diode ED may be disposed between the first electrode AE and the second electrode CE above the first planarization layer OC1. The light-emitting diode ED may be disposed on the first insulating layer ILL An end of the light-emitting diode ED may be connected to the first electrode AE, and another end of the light-emitting diode ED may be connected to the second electrode CE. For example, the light-emitting diodes ED may include active layers having the same material so that they may emit light of the same wavelength or light of the same color. The light emitted from each of the first to third light-emitting areas LA1, LA2 and LA3 may have the same color. For example, the light-emitting diodes ED may emit light of the third color or blue light having a peak wavelength in the range of about 440 nm to about 480 nm. Therefore, the emission element layer EML may emit light of the third color or blue light.

The second bank BNK2 may be disposed on the first planarization layer OC1 to define first to third light-emitting areas LA1, LA2, and LA3. For example, the second bank BNK2 may surround each of the first to third light-emitting areas LA1, LA2 and LA3. It is, however, to be understood that the disclosure is not limited thereto. The second bank BNK2 may separate and insulate the first electrode AE or the second electrode CE of a light-emitting element EL from that of an adjacent light-emitting element EL. The second bank BNK2 may be disposed in the first to third light-blocking areas BBA1, BBA2 and BBA3.

The second passivation layer PAS2 may be disposed on the plurality of light-emitting elements EL and the second bank BNK2. The second passivation layer PAS2 may cover the plurality of light-emitting elements EL to protect the plurality of light-emitting elements EL. The second passivation layer PAS2 can prevent permeation of impurities such as moisture and air from outside to prevent damage to the plurality of light-emitting elements EL.

The second planarization layer OC2 may be disposed on the second passivation layer PAS2 to provide a flat surface over the emission element layer EML. The second planarization layer OC2 may include an organic material. For example, the second planarization layer OC2 may be at least one of an acrylic resin, an epoxy resin, a phenol resin, a polyamide resin, and a polyimide resin.

The wavelength conversion layer WLCL may include a first capping layer CAP1, a first light-blocking member BK1, a first wavelength-converting part WLC1, a second wavelength-converting part WLC2, a light-transmitting part LTU, a second cap layer CAP2, and a third planarization layer OC3.

The first capping layer CAP1 may be disposed on the second planarization layer OC2 of the emission element layer EML. The first capping layer CAP1 may seal the lower surfaces of the first and second wavelength-converting parts WLC1 and WLC2 and the light transmitting part LTU. The first capping layer CAP1 may include an inorganic material. For example, the first capping layer CAP1 may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The first light-blocking member BK1 may be disposed in the first to third light-blocking areas BBA1, BBA2 and BBA3 on the first capping layer CAP1. The first light-blocking member BK1 may overlap the second bank BNK2 in the thickness direction. The first light-blocking member BK1 can block the transmission of light. The first light-blocking member BK1 can improve the color gamut by preventing lights from intruding and mixing among the first to third light-emitting areas LA1, LA2 and LA3. The first light-blocking member BK1 may be arranged in a lattice shape surrounding the first to third light-emitting areas LA1, LA2, and LA3 when viewed from the top.

The first light-blocking member BK1 may include an organic light-blocking material and a liquid repellent component. Herein, the liquid repellent component may be composed of a fluorine-containing monomer or a fluorine-containing polymer, and specifically, may include a fluorine-containing aliphatic polycarbonate. For example, the first light-blocking member BK1 may be made of a black organic material including the liquid repellent component. The first light-blocking member BK1 may be formed via coating and exposure processes for an organic light-blocking material containing a liquid repellent component, etc.

Since the first light-blocking member BK1 may include the liquid repellent component, the first and second wavelength-converting parts WLC1 and WLC2 and the light-transmitting part LTU may be separated so that they can correspond to the respective light-emitting areas LA. For example, in case that the first and second wavelength conversion parts WLC1 and WLC2 and the light-transmitting part LTU may be formed by an inkjet method, an ink composition may flow on the upper surface of the first light-blocking member BK1. In this regard, the first light-blocking member BK1 includes the liquid-repellent component, and thus it may be possible to guide the ink composition to flow to the light-emitting areas. Therefore, the first light-blocking member BK1 can prevent the ink composition from mixing.

The first wavelength-converting part WLC1 may be disposed in the first light-emitting area LA1 on the first capping layer CAP1. The first wavelength-converting part WLC1 may be surrounded by the first light-blocking member BK1. The first wavelength-converting part WLC1 may include a first base resin BS1, first scatterers SCT1, and first wavelength shifters WLS1.

The first base resin BS1 may include a material having a relatively high light transmittance. The first base resin BS1 may be made of a transparent organic material. For example, the first base resin BS1 may include at least one organic material among an epoxy resin, an acrylic resin, a cardo resin, and an imide resin.

The first scatterers SCT1 may have a refractive index different from that of the first base resin BS1 and may form an optical interface with the first base resin BS1. For example, the first scatterers SCT1 may include a light scattering material or light scattering particles that scatter at least a part of transmitted light. For example, the first scatterers SCT1 may include a metal oxide such as titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), or a combination thereof, or may include organic particles such as an acrylic resin, a urethane resin, or a combination thereof. The first scatters SCT1 may scatter light in random directions irrespective of the incidence direction of the incident light, without substantially changing the peak wavelength of the incident light.

The first wavelength shifters WLS1 may convert or shift the peak wavelength of the incident light to a first peak wavelength. For example, the first wavelength shifters WLS1 may convert blue light provided from the display device 10 into red light having a single peak wavelength in the range of about 610 nm to about 650 nm, and output the light. The first wavelength shifters WLS1 may be quantum dots, quantum rods, phosphor, or a combination thereof. The quantum dots may be particulate matter that emits a color as electrons transition from the conduction band to the valence band.

For example, the quantum dots may be semiconductor nanocrystalline material. The quantum dots have a specific band gap depending on their compositions and size, and can absorb light and emit light having an intrinsic wavelength. Examples of the semiconductor nanocrystals of the quantum dots may include Group IV nanocrystals, Groups II-VI compound nanocrystals, Groups III-V compound nanocrystals, Groups IV-VI nanocrystals, or combinations thereof.

For example, the quantum dots may have a core-shell structure including a core comprising the nanocrystals and a shell surrounding the core. The shells of the quantum dots may serve as a protective layer for maintaining the semiconductor properties by preventing chemical denaturation of the core and as a charging layer for imparting electrophoretic properties to the quantum dots. The shell may be either a single layer or multiple layers. At the interface between the core and the shell, the gradient of the concentrate of atoms in the shell may decrease toward the center. The shell of the quantum dot may be made of an oxide of a metal or a non-metal, a semiconductor compound, a combination thereof, etc.

The light output from the first wavelength shifters WLS1 may have a full width of half maximum (FWHM) of the emission wavelength spectrum of about 45 nm or less, about 40 nm or less, or about 30 nm or less. In this manner, the color purity and color gamut of the colors displayed by the display device 10 can be further improved. The light output from the first wavelength shifts WLS1 may travel in different directions regardless of the incidence direction of the incident light. Accordingly, the side visibility of the red color displayed in the first light-emitting area TA1 can be improved.

A part of the blue light emitted from the emission element layer EML may pass through the first wavelength-converting part WLC1 without being converted into red light by the first wavelength shifters WLS1. In case that such blue light may be incident on the first color filter CF1, it can be blocked by the first color filter CF1. On the other hand, red light converted by the first wavelength-converting part WLC1 may pass through the first color filter CF1 to exit to the outside. Accordingly, the first light-emitting area LA1 may emit red light.

The second wavelength-converting part WLC2 may be disposed in the second light-emitting area LA2 on the first capping layer CAP1. The second wavelength-converting part WLC2 may be surrounded by the first light-blocking member BK1. The second wavelength-converting part WLC2 may include a second base resin BS2, second scatterers SCT2, and second wavelength shifters WLS2.

The second base resin BS2 may include a material having a relatively high light transmittance. The second base resin BS2 may be made of a transparent organic material. For example, the second base resin BS2 may be made of the same material as the first base resin BS1 or may be made of at least one of the above-listed materials of the first base resin BS1.

The second scatterers SCT2 may have a refractive index different from that of the second base resin BS2 and may form an optical interface with the second base resin BS2. For example, the second scatterers SCT2 may include a light scattering material or light scattering particles that scatter at least a part of transmitted light. For example, the second scatterers SCT2 may be made of the same material as the first scatterers SCT1 or may be made of at least one of the above-listed materials of the first scatterers SCT1. The second scatters SCT2 may scatter light in random directions irrespective of the incidence direction of the incident light, without substantially changing the peak wavelength of the incident light.

The second wavelength shifters WLS2 may convert or shift the peak wavelength of the incident light to a second peak wavelength that may be different from the first peak wavelength of the first wavelength shifters WLS1. For example, the second wavelength shifters WLS2 may convert blue light provided from the display device 10 into blue light having a single peak wavelength in the range of about 510 nm to about 550 nm, and output the light. The second wavelength shifters WLS2 may be quantum dots, quantum rods, or phosphor. The second wavelength shifters WLS2 may include the above-listed materials of the first wavelength shifters WLS1. The wavelength conversion range of the second wavelength shifters WLS2 may be formed of quantum dots, quantum rods, phosphor, or a combination thereof, so that it may be different from the wavelength conversion range of the first wavelength shifters WLS1.

The light-transmitting part LTU may be disposed in the third light-emitting area LA3 on the first capping layer CAP1. The light-transmitting part LTU may be surrounded by the first light-blocking member BK1. The light-transmitting part LTU may transmit the incident light without converting its peak wavelength. The light-transmitting part LTU may include a third base resin BS3 and third scatterers SCT3.

The third base resin BS3 may include a material having a relatively high light transmittance. The third base resin BS3 may be made of a transparent organic material. For example, the third base resin BS3 may be made of the same material as the first base resin BS1 or the second resin BS2 or may be made of at least one of the above-listed materials of the first base resin BS1 or the second base resin BS2.

The third scatterers SCT3 may have a refractive index different from that of the third base resin BS3 and may form an optical interface with the third base resin BS3. For example, the third scatterers SCT3 may include a light scattering material or light scattering particles that scatter at least a part of transmitted light. For example, the third scatterers SCT3 may be made of the same material as the first scatterers SCT1 or the second scatterers SCT2, or may be made of at least one of the above-listed materials of the first scatterers SCT1 or the second scatterers SCT2. The third scatters SCT3 may scatter light in random directions irrespective of the incidence direction of the incident light, without substantially changing the peak wavelength of the incident light.

The wavelength conversion layer WLCL may be disposed on (e.g., directly on) the second planarization layer OC2 of the emission element layer EML, so that the display device 10 may not require a separated substrate for the first and second wavelength-converting parts WLC1 and WLC2 and the light-transmitting part LTU. Therefore, the first and second wavelength-converting parts WLC1 and WLC2 and the light-transmitting part LTU can be easily aligned with the first to third light-emitting areas LA1, LA2 and LA3, respectively, so that the thickness of the display device 10 can be reduced relatively.

The second capping layer CAP2 may cover the first and second wavelength-converting parts WLC1 and WLC2, the light-transmitting part LTU, and the first light-blocking member BK1. For example, the second capping layer CAP2 may seal the first and second wavelength-converting parts WLC1 and WLC2 and the light-transmitting part LTU to thereby prevent damage or contamination to the first and second wavelength-converting parts WLC1 and WLC2 and the light-transmitting part LTU. The second capping layer CAP2 may be made of the same material as the first capping layer CAP1, or may be made of at least one of the above-listed materials of the first capping layer CAP1.

The third planarization layer OC3 may be disposed on the second capping layer CAP2 to provide the flat top surfaces of the first and second wavelength-converting parts WLC1 and WLC2 and the light-transmitting part LTU. The third planarization layer OC3 may include an organic material. For example, the third planarization layer OC3 may be at least one of an acrylic resin, an epoxy resin, a phenol resin, a polyamide resin, and a polyimide resin.

The color filter layer CFL may include a second light-blocking member BK2, the first to third color filters CF1, CF2 and CF3, and the third passivation layer PAS3.

The second light-blocking member BK2 may be disposed in the first to third light-blocking areas BBA1, BBA2 and BBA3 on the third planarization layer OC3 of the wavelength conversion layer WLCL. The second light-blocking member BK2 may overlap the first light-blocking member BK1 or the second bank BK2 in the thickness direction. The second light-blocking member BK2 can block the transmission of light. The second light-blocking member BK2 can improve the color gamut by preventing lights from intruding and mixing among the first to third light-emitting areas LA1, LA2 and LA3. The second light-blocking member BK2 may be arranged in a lattice shape surrounding the first to third light-emitting areas LA1, LA2 and LA3 when viewed from the top.

The first color filter CF1 may be disposed in the first light-emitting area LA1 on the third planarization layer OC3. The first color filter CF1 may be surrounded by the second light-blocking member BK2. The first color filter CF1 may overlap the first wavelength-converting part WLC1 in the thickness direction. The first color filter CF1 may selectively transmit light of the first color (e.g., red light) and may block and absorb light of the second color (e.g., green light) and light of the third color (e.g., blue light). For example, the first color filter CF1 may be a red color filter and may include a red colorant. The red colorant may be made of a red dye or a red pigment.

The second color filter CF2 may be disposed in the second light-emitting area LA2 on the third planarization layer OC3. The second color filter CF2 may be surrounded by the second light-blocking member BK2. The second color filter CF2 may overlap the second wavelength-converting part WLC2 in the thickness direction. The second color filter CF2 may selectively transmit light of the second color (e.g., green light) and may block and absorb light of the first color (e.g., red light) and light of the third color (e.g., blue light).

For example, the second color filter CF2 may be a green color filter and may include a green colorant. The green colorant may be made of a green dye or a green pigment.

The third color filter CF3 may be disposed in the third light-emitting area LA3 on the third planarization layer OC3. The third color filter CF3 may be surrounded by the second light-blocking member BK2. The third color filter CF3 may overlap the light-transmitting part LTU in the thickness direction. The third color filter CF3 may selectively transmit light of the third color (e.g., blue light) and may block and absorb light of the first color (e.g., red light) and light of the second color (e.g., green light). For example, the third color filter CF3 may be a blue color filter and may include a blue colorant. The blue colorant may be made of a blue dye or a blue pigment.

The first to third color filters CF1, CF2 and CF3 may absorb a part of the light introduced from the outside of the display device 10 to reduce reflection of external light. Accordingly, the first to third color filters CF1, CF2 and CF3 can prevent color distortion due to reflection of external light.

The first to third color filters CF1, CF2 and CF3 may be disposed on (e.g., directly on) the third planarization layer OC3 of the wavelength conversion layer WLCL, and thus the display device 10 may not require a separate substrate for the first to third color filters CF1, CF2 and CF3. Therefore, the thickness of the display device 10 can be relatively reduced.

The third passivation layer PAS3 may cover the first to third color filters CF1, CF2 and CF3. The third passivation layer PAS3 can protect the first to third color filters CF1, CF2 and CF3.

The encapsulation layer TFE may be disposed on the third passivation layer PAS3 of the color filter layer CFL. The encapsulation layer TFE may cover the upper and side surfaces of a display layer. For example, the encapsulation layer TFE may include at least one inorganic layer to prevent permeation of oxygen or moisture. The encapsulation layer TFE may include at least one organic layer to protect the display device 10 from foreign substances such as dust.

Figure 4:
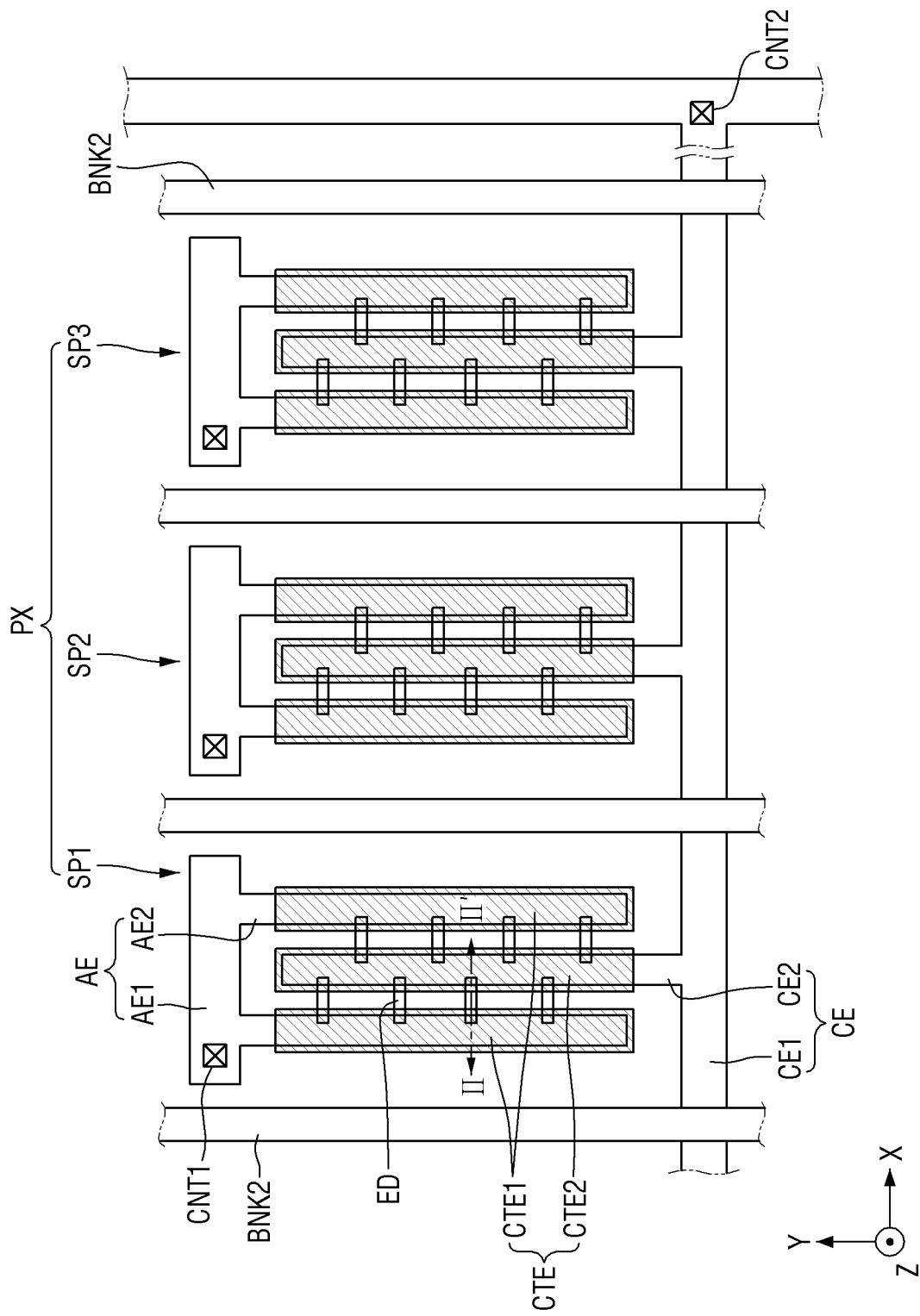
FIG. 4 is a schematic plan view showing a pixel of a display device according to an embodiment of the disclosure.

FIG. 4 is a schematic plan view showing a pixel of a display device according to an embodiment of the disclosure.

Referring to FIG. 4, each of the pixels PX may include first to third sub-pixels SP1, SP2 and SP3. The first to third sub-pixels SP1, SP2 and SP3 may correspond to the first to third light-emitting areas LA1, LA2 and LA3, respectively. The light-emitting diodes ED of the first to third sub-pixels SP1, SP2 and SP3 may emit light through the first to third light-emitting areas LA1, LA2 and LA3, respectively.

The first to third sub-pixels SP1, SP2, and SP3 may emit light of the same color. For example, the first to third sub-pixels SP1, SP2 and SP3 may include the light-emitting diodes ED of the same type, and may emit light of the third color or blue light. As another example, the first sub-pixel SP1 may emit light of the first color or red light, the second sub-pixel SP2 may emit light of the second color or green light, and the third sub-pixel SP3 may emit light of the third color or blue light.

Each of the first to third sub-pixels SP1, SP2 and SP3 may include the first and second electrodes AE and CE, light-emitting diodes ED, contact electrodes CTE, and second banks BNK2.

The first and second electrodes AE and CE may be electrically connected to the light-emitting diodes ED to receive a voltage, and the light-emitting diodes ED may emit light of a certain wavelength band. At least a portion of the first and second electrodes AE and CE may form an electric field in the pixel SP, and the light-emitting diodes ED may be aligned by the electric field.

For example, the first electrode AE may be a pixel electrode separated for each of the first to third sub-pixels SP1, SP2 and SP3, and the second electrode CE may be a common electrode extended across the first to third sub-pixel SP1, SP2 and SP3. One of the first electrode AE and the second electrode CE may be the anode electrode of the light-emitting diodes ED, while another may be the cathode electrode of the light-emitting diodes ED.

The first electrode AE may include a first electrode stem AE1 extended in the first direction (x-axis direction), and at least one first electrode branch AE2 branching off from the first electrode stem AE1 and extended in the opposite direction, e.g., to the second direction (y-axis direction).

The first electrode stem AE1 of each of the first to third sub-pixels SP1, SP2 and SP3 may be spaced apart from the first electrode stem AE1 of an adjacent sub-pixel, and the first electrode stem AE1 may be disposed on an imaginary extension line with the first electrode stem AE1 of the sub-pixel adjacent in the first direction (x-axis direction). The first electrode stems AE1 of the first to third sub-pixels SP1, SP2 and SP3 may receive different signals, respectively, and may be driven individually.

The first electrode branch AE2 may branch off from the first electrode stem AE1 and may be extended in the opposite direction, e.g., to the second direction (y-axis direction). An end of the first electrode branch AE2 may be extended to the first electrode stem AE1, while the other end of the first electrode branch AE2 may be spaced apart from the second electrode stem CE1 opposed to the first electrode stem AE1.

The second electrode CE may include a second electrode stem CE1 extended in the first direction (x-axis direction), and a second electrode branch CE2 branching off from the second electrode stem CE1 and extended in the second direction (y-axis direction). The second electrode stem CE1 of each of the first to third sub-pixels SP1, SP2 and SP3 may be extended to the second electrode stem CE1 of an adjacent sub-pixel. The second electrode stem CE1 may be extended in the first direction (x-axis direction) to traverse the sub-pixels PX. The second electrode stem CE1 may be extended to a portion extended in a direction at the outer portion of the display area DA or in the non-display area NDA.

The second electrode branch CE2 may be spaced apart from and face the first electrode branch AE2. An end of the second electrode branch CE2 may be extended to the second electrode stem CE1, while the other end of the second electrode branch CE2 may be spaced apart from the first electrode stem AE1.

The first electrode AE may be electrically connected to the thin-film transistor layer TFTL of the display device 10 through a first contact hole CNT1, and the second electrode CE may be electrically connected to the thin-film transistor layer TFTL of the display device 10 through a second contact hole CNT2. For example, the first contact hole CNT1 may be formed in each of the first electrode stems AE1, and the second contact hole CNT2 may be formed in the second electrode stem CE1. It is, however, to be understood that the disclosure is not limited thereto.

The second bank BNK2 may be disposed at the boundary between the pixels PX. The first electrode stems AE1 may be spaced apart from one another with respect to the second banks BNK2. The second banks BNK2 may be extended in the second direction (y-axis direction) and may be disposed at the boundaries of the pixels PX arranged in the first direction (x-axis direction). The second banks BNK2 may be disposed at the boundaries of the pixels PX arranged in the second direction (y-axis direction) as well. The second banks BNK2 may define the boundaries of the pixels PX.

In case that an ink in which the light-emitting diodes ED are dispersed may be ejected during the process of fabricating the display device 10, the second bank BNK2 can prevent the ink from flowing over the boundaries of the pixels SP. The second banks BNK2 can separate the inks in which different light-emitting diodes ED may be dispersed from each other so that the inks may not be mixed with each other.

The light-emitting diodes ED may be disposed between the first electrode AE and the second electrode CE. An end of the light-emitting diode ED may be connected to the first electrode AE, and another end of the light-emitting diode ED may be connected to the second electrode CE. For example, the light-emitting diodes ED may be connected to the first electrode AE through a first contact electrode CTE1, and may be connected to the second electrode CE through a second contact electrode CTE2.

The light-emitting diodes ED may be spaced apart from one another and may be substantially aligned in parallel with one another. The spacing between the light-emitting diodes ED is not particularly limited herein. Some of the light-emitting diodes ED may be disposed adjacent to one another, some others of the light-emitting diodes ED may be spaced apart at certain spacing, and yet others of the light-emitting diodes ED may be aligned in certain directions with non-uniform densities. For example, the light-emitting diodes ED may be arranged in the direction perpendicular to the direction in which the first electrode branch AE2 or the second electrode branch CE2 may be extended. As another example, the light-emitting diodes ED may be arranged in a direction oblique to the direction in which the first electrode branch AE2 or the second electrode branch CE2 may be extended.

The light-emitting diodes ED may include active layers having the same material so that they may emit light of the same wavelength range or light of the same color. The first to third sub-pixels SP1, SP2 and SP3 may emit light of the same color. For example, the light-emitting diodes ED may emit light of the third color or blue light having a peak wavelength in the range of about 440 nm to about 480 nm. Therefore, the emission element layer EML of the display device 10 may emit light of the third color or blue light. As another example, the first to third sub-pixels SP1, SP2 and SP3 may include the light-emitting diodes ED having different active layers and may emit lights of different colors.

The contact electrodes CTE may include first and second contact electrodes CTE1 and CTE2. The first contact electrode CTE1 may cover the first electrode branch AE2 and parts of the light-emitting diodes ED, and may electrically connect the first electrode branch AE2 with the light-emitting diodes ED. The second contact electrode CTE2 may cover the second electrode branch CE2 and other parts of the light-emitting diodes ED and may electrically connect the second electrode branch CE2 with the light-emitting diodes ED.

The first contact electrode CTE1 may be disposed on the first electrode branch AE2 and extended in the second direction (y-axis direction). The first contact electrode CTE1 may be in contact with first ends of the light-emitting diodes ED. The light-emitting diodes ED may be electrically connected to the first electrode AE through the first contact electrode CTE.

The second contact electrode CTE2 may be disposed on the second electrode branch CE2 and extended in the second direction (y-axis direction). The second contact electrode CTE2 may be spaced apart from the first contact electrode CTE1 in the first direction (x-axis direction). The second contact electrode CTE2 may be in contact with second ends of the light-emitting diodes ED. The light-emitting diodes ED may be electrically connected to the second electrode CE through the second contact electrode CTE2.

For example, the widths of the first and second contact electrodes CTE1 and CTE2 may be larger than the widths of the first and second electrode branches AE2 and CE2, respectively. As another example, the first and second contact electrodes CTE1 and CTE2 may cover sides of the first and second electrode branches AE2 and CE2, respectively.

Figure 5:
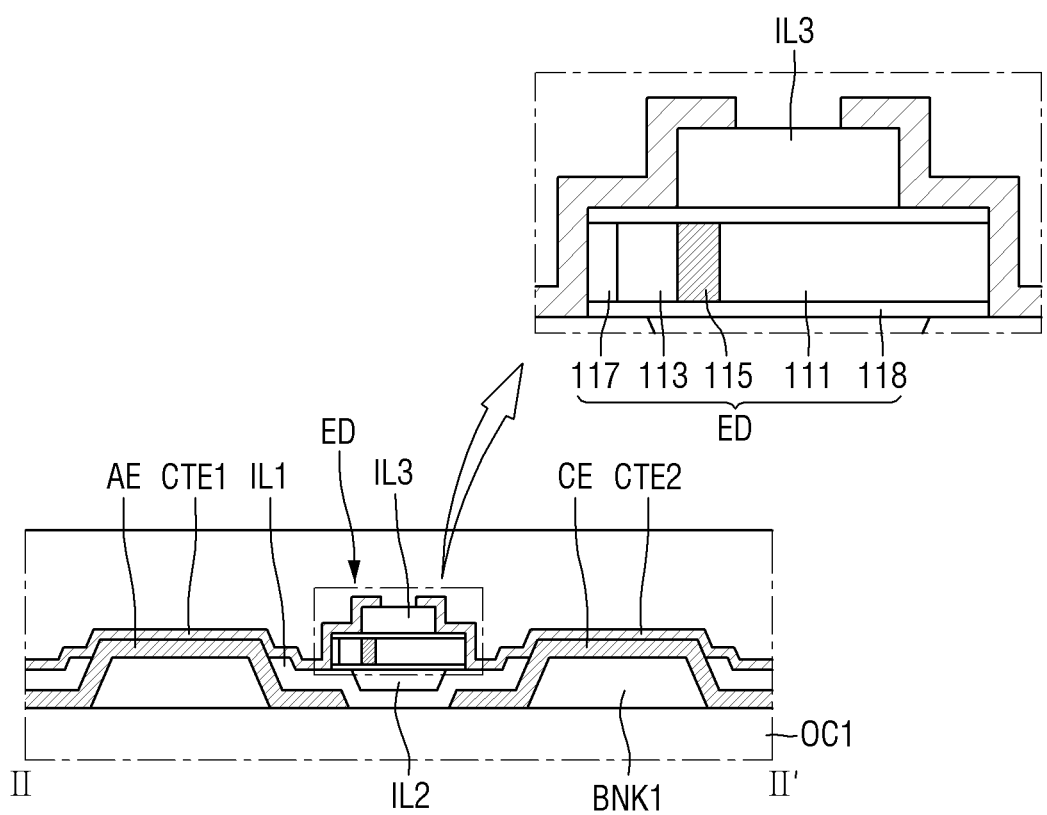
FIG. 5 is a schematic cross-sectional view taken along line II-II' of FIG. 4.

FIG. 5 is a schematic cross-sectional view taken along line II-II' of FIG. 4.

Referring to FIG. 5, the emission element layer EML of the display device 10 may be disposed on the thin-film transistor layer TFTL, and may include first to third insulating layers ILL IL2 and IL3.

The first banks BNK1 may be disposed in the first to third light-emitting areas LA1, LA2 and LA3, respectively. Each of the first banks BNK1 may correspond to the first electrode AE or the second electrode CE. Each of the first and second electrodes AE and CE may be disposed on the respective first bank BNK1. For example, each of the first and second electrode branches AE2 and CE2 may be disposed on the respective first bank BNK1. The first banks BNK1 may include, but are not limited to, polyimide (PI).

The first banks BNK1 may be disposed on the first planarization layer OC1, and the side surfaces of each of the first banks BNK1 may be inclined from the first planarization layer OC1. For example, each of the first and second electrodes AE and CE may contain a material having a high reflectivity, and may be disposed on the inclined surfaces of the first banks BNK1 to reflect the light emitted from the light-emitting element EL toward the upper side of the display device 10.

Referring to FIG. 5 in conjunction with FIG. 4, the first electrode stem AE1 may include the first contact hole CNT1 penetrating through the first planarization layer OC1. The first electrode stem AE1 may be electrically connected to the thin-film transistor TFT through the first contact hole CNT1. Accordingly, the first electrode AE may receive an electric signal from the thin-film transistor TFT.

The second electrode stem CE1 may be extended in the first direction (x-axis direction) and may be disposed in a non-light-emitting area as well where the light-emitting diodes ED may not be disposed. The second electrode stem CE1 may include the second contact hole CNT2 penetrating through the first planarization layer OC1. The second electrode stem CE1 may be electrically connected to a power electrode through the second contact hole CNT2. The second electrode CE may receive an electric signal from the power electrode.

The first and second electrodes AE and CE may include a transparent conductive material. For example, each of the first and second electrodes AE and CE may include, but are not limited to, at least one of indium tin oxide (ITO), indium zinc oxide (IZO), and indium tin-zinc oxide (ITZO).

The first and second electrodes AE and CE may include a conductive material with high reflectivity. For example, the first and second electrodes AE and CE may include a metal having high reflectivity, such as silver (Ag), copper (Cu), aluminum (Al), or a combination thereof. The first and second electrodes AE and CE can reflect light incident from the light-emitting diodes ED toward the upper side of the display device 10.

The first and second electrodes AE and CE may be made up of a stack of one or more transparent conductive materials and one or more metals having high reflectivity or a single layer including the same. For example, the first and second electrodes AE and CE may have a stack structure of ITO/ silver (Ag)/ITO/IZO, or may be an alloy including aluminum (Al), nickel (Ni), lanthanum (La), etc. It is, however, to be understood that the disclosure is not limited thereto.

The first insulating layer IL1 may be disposed on the first planarization layer OC1, the first electrode AE, and the second electrode CE. The first insulating layer IL1 may partially cover each of the first and second electrodes AE and CE. For example, the first insulating layer IL1 may expose portions of the first and second electrodes AE and CE corresponding to the upper surfaces of the first banks BNK1, and may cover the other portions of the first and second electrodes AE and CE that do not correspond to the upper surfaces. Accordingly, the first insulating layer IL1 may include openings exposing portions of the first and second electrodes AE and CE corresponding to the upper surfaces of the first banks BNK1.

For example, the first insulating layer IL1 may include an inorganic insulating material, and may include depressed portions between the first and second electrodes AE and CE. The depressed portions of the first insulating layer IL1 may be filled with the second insulating layer IL2. Accordingly, the second insulating layer IL2 can make the upper surface of the first insulating layer IL1 even, and accordingly the light-emitting diodes ED may be disposed on the first and second insulating layers IL1 and IL2.

The first insulating layer IL1 can protect the first and second electrodes AE and CE and may insulate the first and second electrodes AE and CE from each other. The first insulating layer IL1 can prevent that the light-emitting diodes ED may be in direct contact with other elements and damaged by them.

The light-emitting diodes ED may be disposed between the first electrode AE and the second electrode CE on the first and second insulating layers IL1 and IL2. Ends of the light-emitting diodes ED may be connected to the first electrode AE while other ends of the light-emitting diodes ED may be connected to the second electrode CE. For example, the light-emitting diodes ED may be connected to the first electrode AE through the first contact electrode CTE1 and may be connected to the second electrode CE through the second contact electrode CTE2.

The third insulating layer IL3 may be partially disposed on the light-emitting diodes ED disposed between the first electrode AE and the second electrode CE. The third insulating layer IL3 may partially cover the outer surfaces of the light-emitting diodes ED. The third insulating layer IL3 can protect the light-emitting diodes ED.

The contact electrodes CTE may include first and second contact electrodes CTE1 and CTE2. The first contact electrode CTE1 may cover the first electrode branch AE2 and parts of the light-emitting diodes ED, and may electrically connect the first electrode branch AE2 with the light-emitting diodes ED. The second contact electrode CTE2 may cover the second electrode branch CE2 and other parts of the light-emitting diodes ED and may electrically connect the second electrode branch CE2 with the light-emitting diodes ED.

The contact electrodes CTE may include a conductive material. For example, the contact electrodes CTE may include, but are not limited to, ITO, IZO, ITZO, aluminum (Al), etc., or a combination thereof.

Figure 6:
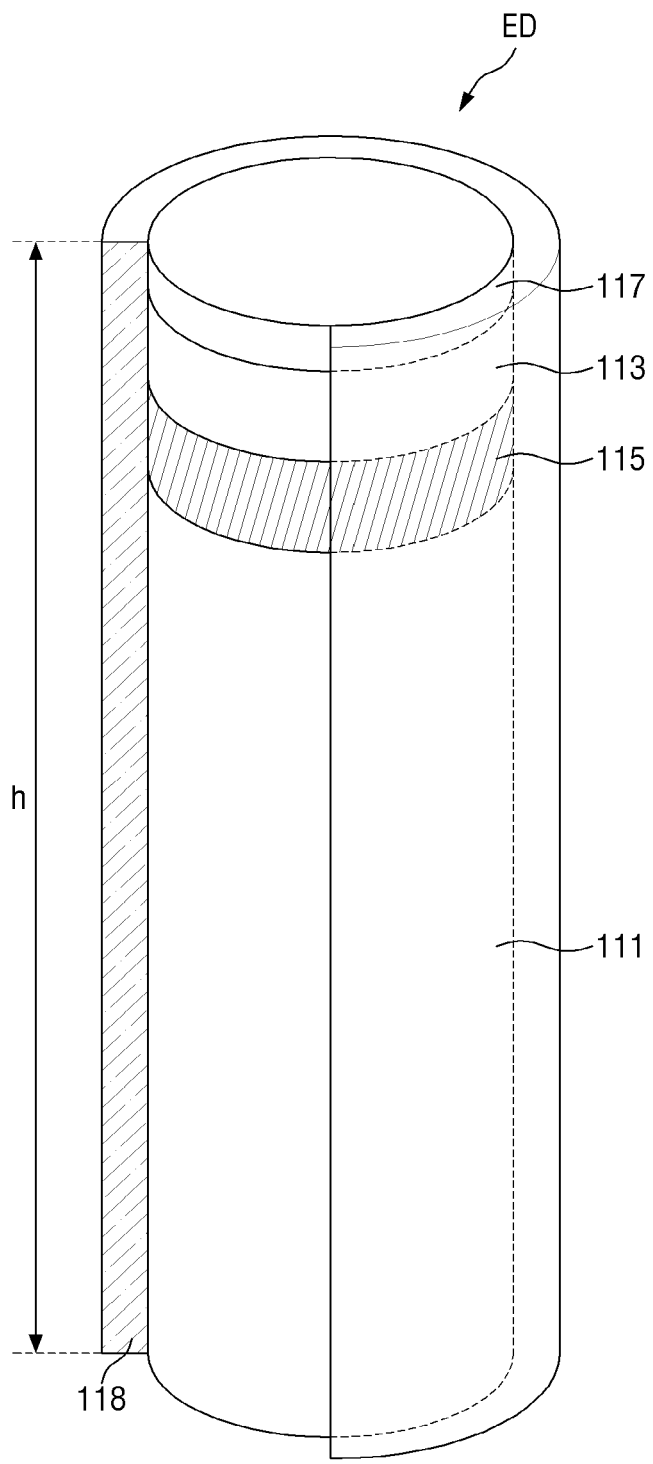
FIG. 6 is a schematic view showing a light-emitting element according to an embodiment of the disclosure.

FIG. 6 is a schematic view showing a light-emitting element according to an embodiment of the disclosure.

Referring to FIG. 6, the light-emitting diodes ED may have a size of a micro-meter or a nano-meter, and may be an inorganic light emitting diode containing an inorganic material. Inorganic light-emitting diodes may be aligned between two electrodes facing each other as polarities may be created by forming an electric field in a particular direction between the two electrodes.

The light-emitting diode ED may have a shape extended in a direction. The light-emitting diode ED may have a shape of a rod, wire, tube, etc. For example, the light-emitting diode ED may have a cylindrical or rod-like shape. As another example, the light-emitting diode ED may have a variety of shapes including a polygonal column shape such as a cube, a cuboid and a hexagonal column, or a shape that may be extended in a direction with partially inclined portions. The semiconductors included in the light-emitting diode ED may have a structure sequentially arranged or stacked along a direction.

The light-emitting diode ED may include a first semiconductor layer 111, a second semiconductor layer 113, an active layer 115, an electrode layer 117, and an insulating layer 118.

The first semiconductor layer 111 may be an n-type semiconductor. For example, in case that the light-emitting element EL emits blue light, the first semiconductor layer 111 may include a semiconductor material having the following chemical formula: $Al_xGa_yIn_{1-x-y}N$ ($0 \leq x \leq 1$, $0 \leq y \leq 1$, $0 \leq x+y \leq 1$). The first semiconductor layer 111 may be at least one semiconductor material among n-type doped AlGaInN, GaN, AlGaN, InGaN, AlN and InN. The first semiconductor layer 111 may be doped with an n-type dopant such as Si, Ge and Sn. The first semiconductor layer 111 may be n-GaN doped with n-type Si. The length of the first semiconductor layer 111 may range, but is not limited to, from about 1.5 μm to about 5 μm.

The second semiconductor layer 113 may be disposed on the active layer 115. For example, in case that the light-emitting element EL emits blue light or green light, the second semiconductor layer 113 may include a semiconductor material having the following chemical formula: $Al_xGa_yIn_{1-x-y}N$ ($0 \leq x \leq 2$, $0 \leq y \leq 1$, $0 \leq x+y \leq 1$). For example, the second semiconductor layer 113 may be at least one semiconductor material among p-type doped AlGaInN, GaN, AlGaN, InGaN, AlN and InN. The second semiconductor layer 113 may be doped with a p-type dopant such as Mg, Zn, Ca, Se and Ba. The second semiconductor layer 113 may be p-GaN doped with p-type Mg. The length of the second semiconductor layer 113 may range, but is not limited to, from about 0.05 μm to about 0.10 μm.

Each of the first and second semiconductor layers 111 and 113 may be made up of, but are not limited to, a single layer. For example, each of the first and second semiconductor layers 111 and 113 may have layers including a clad layer or a tensile strain barrier reducing (TSBR) layer.

The active layer 115 may be disposed between the first and second semiconductor layers 111 and 113. The active layer 115 may include a material having a single or multiple quantum well structure. In case that the active layer 115 includes a material having the multiple quantum well structure, quantum layers and well layers may be alternately stacked on one another. The active layer 115 may emit light as electron-hole pairs may be combined therein in response to an electrical signal applied through the first semiconductor layer 111 and the second semiconductor layer 113. For example, in case that the active layer 115 emits blue light, it may include a material such as AlGaN, AlGaInN, or a combination thereof. In case that the active layer 115 has a multi-quantum well structure in which quantum layers and well layers may be alternately stacked on one another, the quantum layers may include AlGaN, AlGaInN, etc., or a combination thereof, and the well layers may include GaN, AlInN, etc., or a combination thereof. The active layer 115 may include AlGaInN as a quantum layer and AlInN as a well layer to emit blue light.

In another embodiment, the active layer 115 may have a structure in which a semiconductor material having a large band gap energy and a semiconductor material having a small band gap energy may be alternately stacked on one another, and may include Group III to Group V semiconductor materials depending on the wavelength range of the emitted light. The light emitted from the active layer 115 is not limited to the blue light. The active layer 115 may emit light of red or green in some implementations. The length of the active layer 115 may range, but is not limited to, from about 0.05 µm to about 0.10 µm.

The light emitted from the active layer 115 may exit in the longitudinal direction of the light-emitting diode ED as well as through both side surfaces. The directivity of light emitted from the active layer 115 may not be limited.

The electrode layer 117 may be an ohmic contact electrode. As another example, the electrode layer 117 may be a Schottky contact electrode. The light-emitting diode ED may include at least one electrode layer 117. The electrode layer 117 can reduce the resistance between the light-emitting diode ED and the electrode or the contact electrodes CTE in case that the light-emitting diode ED is electrically connected to the electrode or the contact electrodes CTE. The electrode layer 117 may include a metal having conductivity. For example, the electrode layer 117 may include at least one of aluminum (Al), titanium (Ti), indium (In), gold (Au), silver (Ag), indium tin oxide (ITO), indium zinc oxide (IZO), and indium tin-zinc oxide (ITZO). The electrode layer 117 may include a semiconductor material doped with n-type or p-type impurities.

The insulating layer 118 may surround the outer surfaces of the semiconductor layers and electrode layers. The insulating layer 118 may surround the outer surface of the active layer 115 and may be extended in the direction in which the light-emitting diode ED may be extended. The insulating layer 118 can protect the light-emitting diode ED. For example, the insulating layer 118 may surround the side surface of the light-emitting diode ED and may expose both ends of the light-emitting diode ED in the longitudinal direction.

The insulating layer 118 may include materials having an insulating property such as silicon oxide (SiOx), silicon nitride (SiNx), silicon oxynitride (SiOxNy), aluminum nitride (AlN), aluminum oxide ($Al_2O_3$), or a combination thereof. Accordingly, the insulating layer 118 can prevent an electrical short-circuit that may occur in case that the active layer 115 comes in contact with an electrode through which an electric signal may be transmitted to the light-emitting element EL. Since the insulating layer 118 protects the outer surface of the light-emitting diode ED, including the active layer 115, it may be possible to prevent a decrease in the luminous efficiency.

Figure 7:
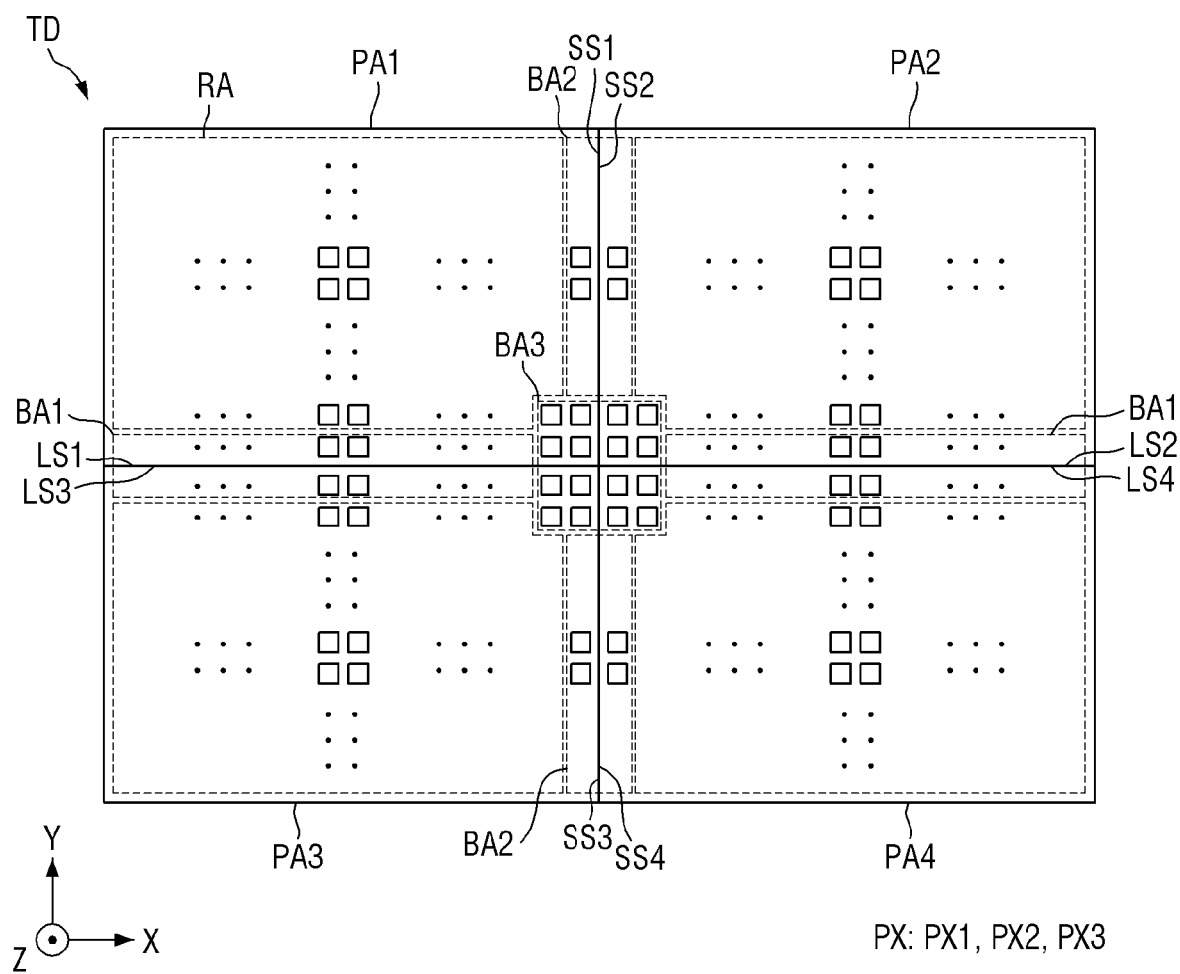
FIG. 7 is a schematic plan view showing a coupling structure of a tiled display according to an embodiment of the disclosure.

FIG. 7 is a schematic plan view showing a coupling structure of a tiled display according to an embodiment of the disclosure.

Referring to FIG. 7, a tiled display TD according to an embodiment of the disclosure may include multiple display devices PA1 to PA4. For example, the tiled display TD may include a first display device PA1, a second display device PA2, a third display device PA3 and a fourth display device PA4. It is, however, to be understood that the number of display devices is not limited to the embodiment of FIG. 7. The number of display devices may vary depending on the size of the tiled display TD.

Each of the display devices PA1 to PA4 may have a rectangular shape including longer sides and shorter sides. The display devices PA1 to PA4 may be arranged such that the longer sides and the shorter sides may be adjacent to or in contact with one another. For example, a first shorter side SS1 of the first display device PA1 may be in contact with a second shorter side SS2 of the second display device PA2, and a first longer side LS1 of the first display device PA1 may be in contact with a third longer side LS3 of the third display device PA3 A second longer side LS2 of the second display device PA2 may be in contact with a fourth longer side LS3 of the fourth display device PA4 adjacent thereto, and a third shorter side SS3 of the third display device PA3 may be in contact with a fourth shorter side SS4 of the fourth display device PA4 adjacent thereto.

According to an embodiment of the disclosure, the tiled display TD may include first boundary areas BA1 where the longer sides of the display devices PA1 to PA4 may be adjacent to each other, and second boundary areas BA2 where the shorter sides thereof may be adjacent to each other. In the first boundary areas BA1, the first longer side LS1 of the first display device PA1 and the third longer side LS3 of the third display device PA3 may be adjacent to each other, and the second longer side LS2 of the second display device PA2 and the fourth longer side LS4 of the fourth display device PA4 may be adjacent to each other. In the second boundary areas BA2, the first shorter side SS1 of the first display device PA1 and the second shorter side SS2 of the second display device PA2 may be adjacent to each other, and the third shorter side SS3 of the third display device PA3 and the fourth shorter side SS4 of the fourth display device PA4 may be adjacent to each other.

In the first boundary areas BA1, the pixels PX may be arranged in the rows of at least two columns. For example, one of the first boundary areas BA1 may include two rows, i.e., a row in which the pixels PX of the first display device PA1 may be arranged and a row in which the pixels PX of the third display device PA3 may be arranged. Another of the first boundary areas BA1 may include two rows, i.e., a row in which the pixels PX of the second display device PA2 may be arranged and a row in which the pixels PX of the fourth display device PA4 may be arranged. It is, however, to be understood that the disclosure is not limited thereto. Each of the first boundary areas BA1 may include three or more rows of the pixels PX.

In the second boundary areas BA2, the pixels PX may be arranged in the columns of at least two rows. For example, one of the second boundary areas BA2 may include two columns, i.e., a column in which the pixels PX of the first display device PA1 may be arranged and a column in which the pixels PX of the second display device PA2 may be arranged. Another of the second boundary areas BA2 may include two columns, i.e., a column in which the pixels PX of the third display device PA3 may be arranged and a column in which the pixels PX of the fourth display device PA4 may be arranged. It is, however, to be understood that the disclosure is not limited thereto. Each of the second boundary areas BA2 may include three or more columns of the pixels PX.

The first boundary areas BA1 may be extended in the first direction (x-axis direction) and may be spaced apart from each other. The second boundary areas BA2 may be extended in the second direction (y-axis direction) and may be spaced apart from each other. A third boundary area BA3 may be disposed between the first boundary areas BA1 and also between the second boundary areas BA2. In the third boundary area BA3, the corners of the first to fourth display devices PA1 to PA4 may be adjacent to one another. For example, in the third boundary area BA3, the first longer side LS1 and the first shorter side SS1 of the first display device PA1 may be adjacent to each other, the second longer side LS2 and the second shorter side SS2 of the second display device PA2 may be adjacent to each other, the third longer side LS3 and the third shorter side SS3 of the third display device PA3 may be adjacent to each other, and the fourth longer side LS4 and the fourth shorter side SS4 of the fourth display device PA4 may be adjacent to each other.

A remaining area RA of the tiled display TD other than the first boundary areas BA1, the second boundary areas BA2 and the third boundary area BA3 may be disposed. The remaining area RA may refer to the area other than the first boundary areas BA1, the second boundary areas BA2 and the third boundary area BA3 of the display devices PA1 to PA4.

Each of the display devices PA1 to PA4 may include pixels PX to display images. In the boundary areas BA1, BA2 and BA3 where the display devices PA1 to PA4 may be in contact with one another, marginal areas between the pixels PX may be formed. Such marginal areas may be margin areas that allow the display devices PA1 to PA4 to be cut, or marginal areas that allow the display devices PA1 to PA4 to be in contact with each other to form a tiled display. The marginal areas may refer to the areas of a single pixel where the light-emitting areas of sub-pixels may not be disposed. As the resolution of a display device increases, the size of the pixels may decrease while the size of the light-emitting areas of the sub-pixels may remain constant. As a result, the size of the marginal areas may decrease.

Hereinafter, a tiled display TD is discussed that can have marginal areas in the above-described boundary areas BA1, BA2 and BA3.

Figure 8:
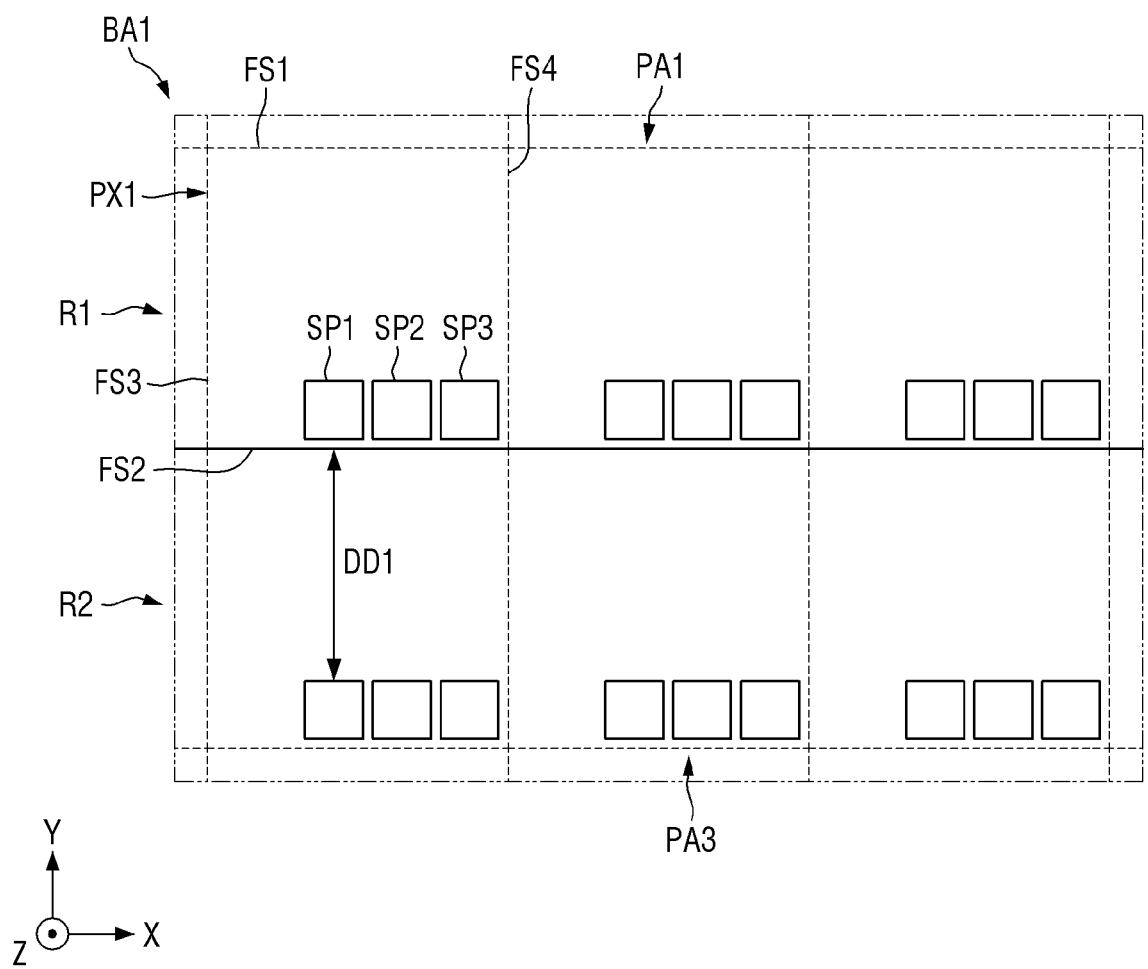
FIG. 8 is a schematic plan view showing an example of a portion of the first boundary area of a tiled display according to an embodiment of the disclosure.
Figure 9:
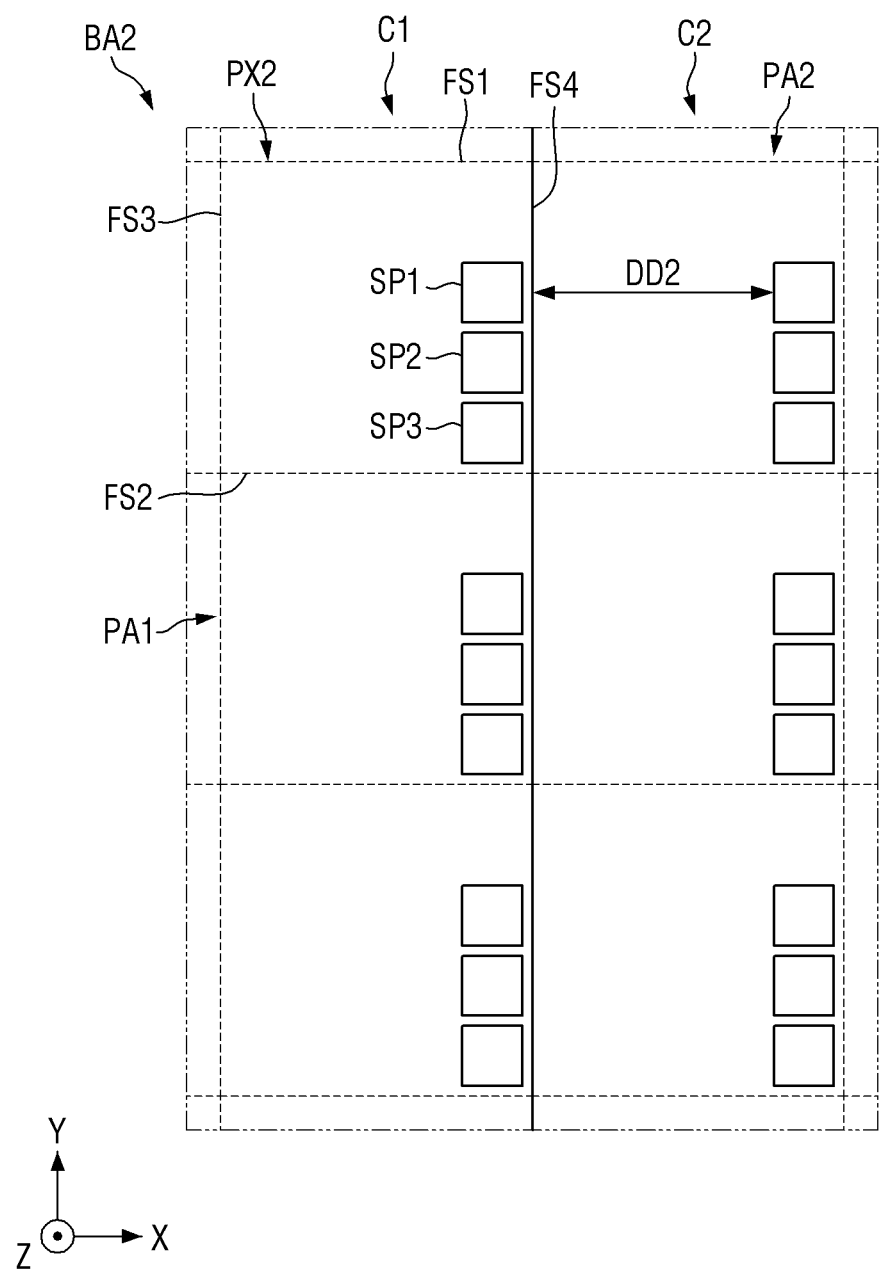
FIG. 9 is a schematic plan view showing an example of a portion of the second boundary area of the tiled display according to an embodiment of the disclosure.
Figure 10:
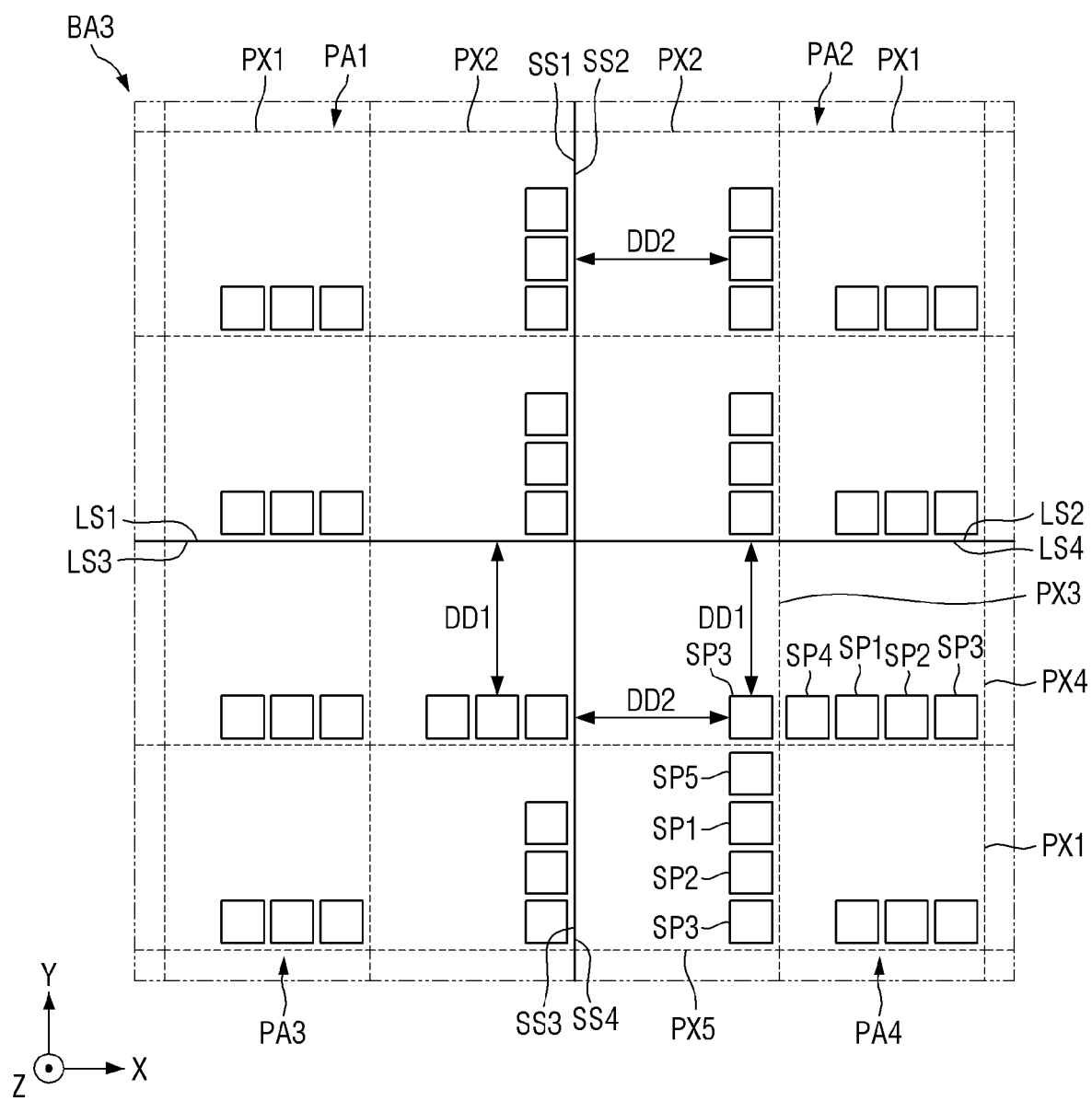
FIG. 10 is a schematic plan view showing an example of a portion of the third boundary area of the tiled display according to an embodiment of the disclosure.
Figure 11:
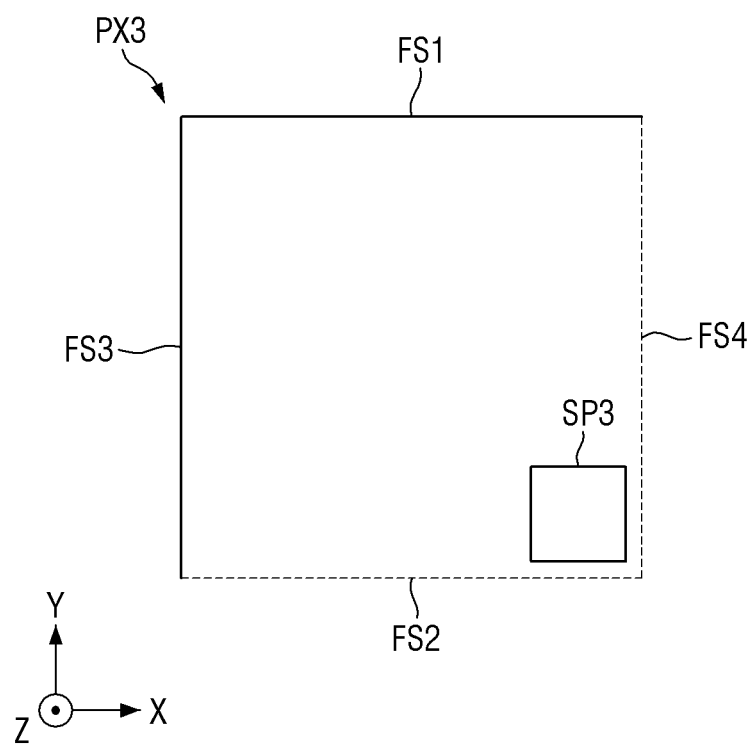
FIG. 11 is a schematic plan view showing a third pixel of the third boundary area of the tiled display according to an embodiment of the disclosure.
Figure 12:
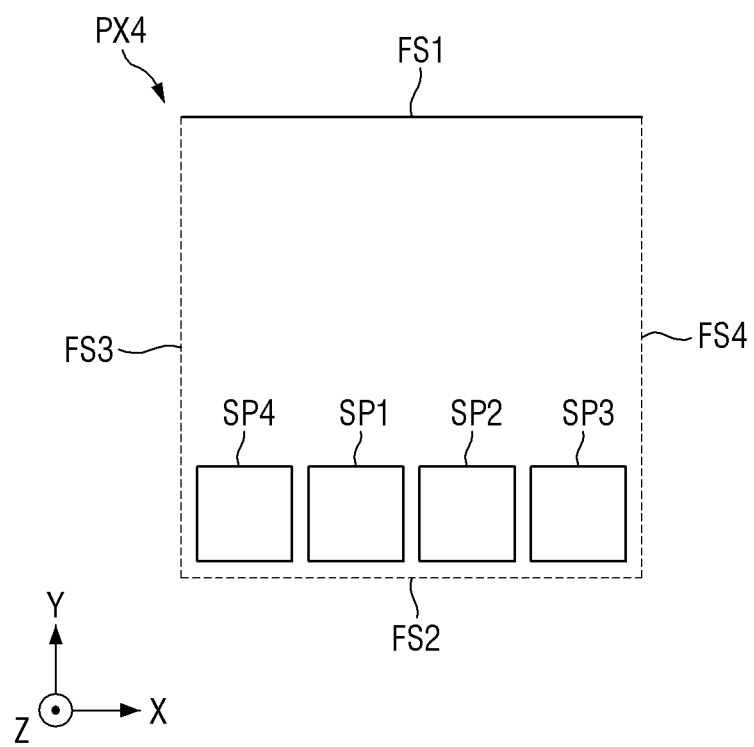
FIG. 12 is a schematic plan view showing a fourth pixel of the third boundary area of the tiled display according to an embodiment of the disclosure.
Figure 13:
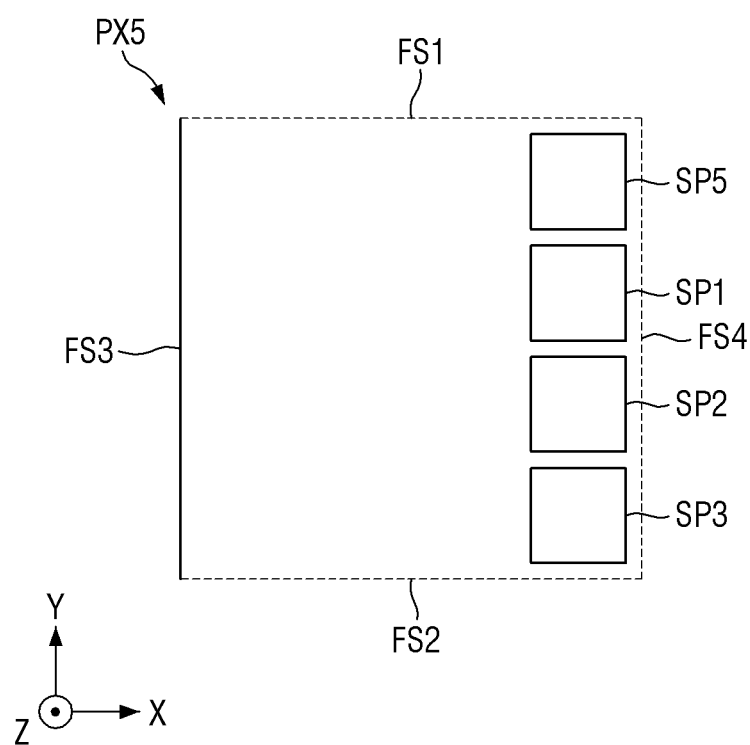
FIG. 13 is a schematic plan view showing a fifth pixel of the third boundary area of the tiled display according to an embodiment of the disclosure.
Figure 14:
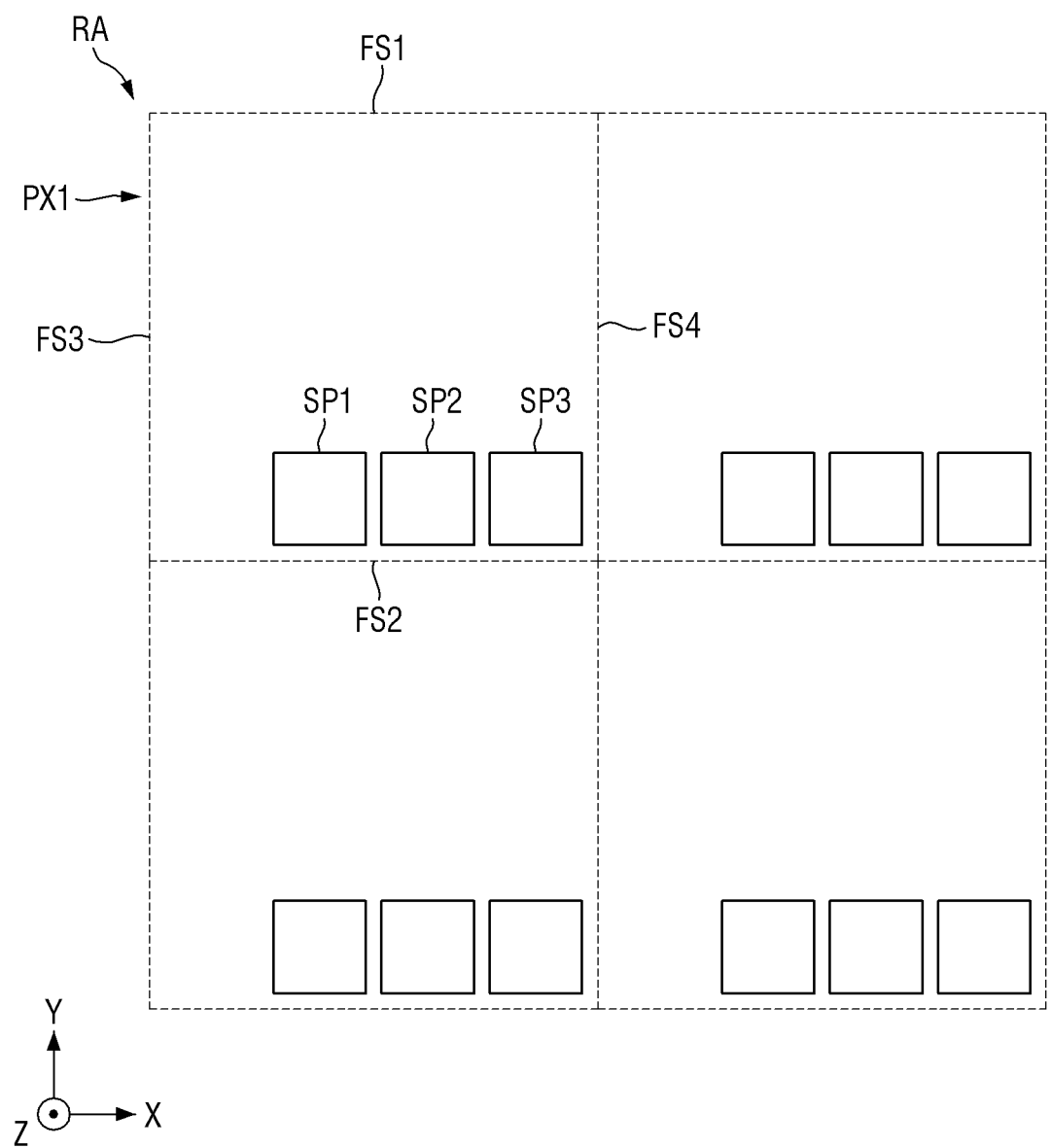
FIG. 14 is a schematic plan view showing a portion of the remaining area of the tiled display according to an embodiment of the disclosure.

FIG. 8 is a schematic plan view showing an example of a portion of the first boundary area of a tiled display according to an embodiment of the disclosure. FIG. 9 is a schematic plan view showing an example of a portion of the second boundary area of the tiled display according to an embodiment of the disclosure. FIG. 10 is a schematic plan view showing an example of a portion of the third boundary area of the tiled display according to an embodiment of the disclosure. FIG. 11 is a schematic plan view showing a third pixel of the third boundary area of the tiled display according to an embodiment of the disclosure. FIG. 12 is a schematic plan view showing a fourth pixel of the third boundary area of the tiled display according to an embodiment of the disclosure. FIG. 13 is a schematic plan view showing a fifth pixel of the third boundary area of the tiled display according to an embodiment of the disclosure. FIG. 14 is a schematic plan view showing a portion of the remaining area of the tiled display according to an embodiment of the disclosure.

Referring to FIG. 8, the first boundary area BA1 according to an embodiment may include multiple first pixels PX1. For example, the first boundary area BA1 may include the first pixels PX1 of the first display device PA1 and the first pixels PX1 of the third display device PA3. The first pixels PX1 of the first display device PA1 may be disposed on the side indicated by the second direction (y-axis direction) while the first pixels PX1 of the third display device PA3 may be disposed on the opposite side of the second direction (y-axis direction) with respect to the first longer side LS1 of the first display device PA1 or the third longer side LS3 of the third display device PA3. In other words, the first pixels PX1 of the first display device PA1 may be arranged in a first row R1, and the first pixels PX1 of the third display device PA3 may be arranged in a second row R2.

Each of the first pixels PX1 disposed in the first boundary areas BA1 may include multiple sub-pixels SP1 to SP3. For example, the sub-pixels SP1, SP2 and SP3 may include a first sub-pixel SP1, a second sub-pixel SP2 and a third sub-pixel SP3. According to an embodiment of the disclosure, the first sub-pixel SP1 may emit light of the first color or blue light, the second sub-pixel SP2 may emit light of the second color or red light, and the third sub-pixel SP3 may emit light of the third color or green light.

The first to third sub-pixels SP1 to SP3 may be arranged in parallel in a direction and may be disposed adjacent to each other. For example, the first to third sub-pixels SP1 to SP3 may be arranged in parallel with the first longer side LS1 of the first display device PA1 or the third longer side LS3 of the third display device PA3, and may be arranged side by side in the first direction (x-axis direction). The first to third sub-pixels SP1 to SP3 may be disposed adjacent to a corner of the first pixel PX1.

According to an embodiment of the disclosure, the first pixel PX1 may include a first side FS1 parallel to the first direction (x-axis direction) and located on the side indicated by the second direction (y-axis direction), a second side FS2 opposed to the first side FS1, a third side FS3 parallel to the second direction (y-axis direction) and located on the opposite side of the first direction (x-axis direction), and a fourth side FS4 opposed to the third side FS3. The first to third sub-pixels SP1 to SP3 may be adjacent to the second side FS2 and the fourth side FS4 of the first pixel PX1. For example, the first to third sub-pixels SP1 to SP3 may be disposed adjacent to the lower right hand side of the first pixel PX1.

Accordingly, as shown in FIG. 8, the first to third sub-pixels SP1 to SP3 of the first pixels PX1 of the third display device PA3 arranged in the first boundary areas BA1 may be spaced apart from the first longer side LS1 of the first display device PA1 by a first distance DD1.

In the first boundary area BA1 where the first display device PA1 and the third display device PA3 may be adjacent to each other, a marginal area may be required in the second direction (y-axis direction). According to this embodiment, the first to third sub-pixels SP1 to SP3 of each of the first pixels PX1 arranged in the first boundary area BA1 may be gathered adjacent to (e.g., closer to) the corner where the second side FS2 and the fourth side FS4 of the first pixel PX1 meet, so that the marginal area in the second direction (y-axis direction) can be formed within the first pixel PX1. The first distance DD1 works as the marginal area for a process of attaching or cutting the first and third display devices PA1 and PA3.

Referring to FIG. 9, the second boundary area BA2 according to an embodiment may include multiple second pixels PX2. The second boundary area BA2 may include the second pixels PX2 of the first display device PA1 and the second pixels PX2 of the second display device PA2. The second pixels PX2 of the first display device PA1 may be disposed on the opposite side of the first direction (x-axis direction) while the second pixels PX2 of the second display device PA2 may be disposed on the side indicated by the first direction (x-axis direction) with respect to the first shorter side SS1 of the first display device PA1 or the second shorter side SS2 of the second display device PA2. In other words, the second pixels PX2 of the first display device PA1 may be arranged in a first column C1, and the second pixels PX2 of the second display device PA2 may be arranged in a second column C2.

Each of the second pixels PX2 disposed in the second boundary areas BA2 may include multiple sub-pixels SP1 to SP3. For example, the sub-pixels SP1, SP2 and SP3 may include a first sub-pixel SP1, a second sub-pixel SP2 and a third sub-pixel SP3. According to an embodiment of the disclosure, the first sub-pixel SP1 may emit light of the first color or blue light, the second sub-pixel SP2 may emit light of the second color or red light, and the third sub-pixel SP3 may emit light of the third color or green light.

The first to third sub-pixels SP1 to SP3 may be arranged in parallel in a direction and may be disposed adjacent to each other. For example, the first to third sub-pixels SP1 to SP3 may be arranged in parallel with the first shorter side SS1 of the first display device PA1 or the second shorter side SS3 of the second display device PA2, and may be arranged side by side in the second direction (y-axis direction). The first to third sub-pixels SP1 to SP3 may be disposed adjacent to a corner of the second pixel PX2.

According to an embodiment of the disclosure, the second pixel PX2 may include a first side FS1 parallel to the first direction (x-axis direction) and located on the side indicated by the second direction (y-axis direction), a second side FS2 opposed to the first side FS1, a third side FS3 parallel to the second direction (y-axis direction) and located on the opposite side of the first direction (x-axis direction), and a fourth side FS4 opposed to the third side FS3. The first to third sub-pixels SP1 to SP3 may be adjacent to the second side FS2 and the fourth side FS4 of the second pixel PX2. For example, the first to third sub-pixels SP1 to SP3 may be disposed adjacent to the lower right hand of the second pixel PX2.

Accordingly, as shown in FIG. 9, the first to third sub-pixels SP1 to SP3 of the second pixels PX2 of the second display device PA2 arranged in the second boundary area BA2 may be spaced apart from the first shorter side SS1 of the first display device PA1 by a second distance DD2.

In the second boundary area BA2 where the first display device PA1 and the second display device PA2 may be adjacent to each other, a marginal area may be required in the first direction (x-axis direction). According to this embodiment, the first to third sub-pixels SP1 to SP3 of each of the second pixels PX2 arranged in the second boundary area BA2 may be gathered adjacent to (e.g., closer to) the corner where the second side FS2 and the fourth side FS4 of the second pixel PX2 meet, so that the marginal area in the first direction (x-axis direction) can be formed within the second pixel PX2. The second distance DD2 works as the marginal area for a process of attaching or cutting the first and second display devices PA1 and PA2.

Referring to FIG. 10, a third boundary area BA3 according to an embodiment may include some of the first display devices PA1, some of the second display devices PA2, some of the third display devices PA3, and some of the display devices PA4. For example, in the third boundary area BA3, a corner where the first shorter side SS1 and the first longer side LS1 of the first display device PA1 meet each other, a corner where the second shorter side SS2 and the second longer side LS2 of the second display device PA2 meet each other, a corner where the third shorter side SS3 and the third longer side LS3 of the third display device PA3 meet each other, and a corner where the fourth shorter side SS4 and the fourth longer side LS4 of the fourth display device PA4 meet each other may meet one another. In other words, the third boundary area BA3 may be the center portion of the tiled display TD.

In the third boundary area BA3, the first display device PA1 may include multiple first pixels PX1 and multiple second pixels PX2. The second pixels PX2 may be disposed adjacent to the first shorter side SS1 of the first display device PA1. At least one of the second pixels PX2 may be disposed adjacent to the first longer side LS1 of the first display device PA1. The first pixels PX1 may be adjacent to the second pixels PX2 and may be disposed adjacent to the first longer side LS1 of the first display device PA1. The second pixels PX2 may be disposed between the first pixels PX1 and the first shorter side SS1 of the first display device PA1.

Each of the first pixels PX1 and the second pixels PX2 may include multiple first to third sub-pixels SP1 to SP3. The first to third sub-pixels SP1 to SP3 of the first pixels PX1 may be arranged in the same manner as those of the first pixels PX1 of the first boundary areas BA1 described above. The first to third sub-pixels SP1 to SP3 of the second pixels PX2 may be arranged in the same manner as those of the second pixels PX2 of the second boundary areas BA2 described above.

According to an embodiment of the disclosure, the third boundary area BA3 may include pixels arranged in a 4-by-4 matrix. The first pixels PX1 of the first display device PA1 may be disposed in the first row and the second row of the first column, respectively. The second pixels PX2 of the first display device PA1 may be disposed in the first row and the second row of the second column, respectively.

In the third boundary area BA3, the second display device PA2 may include multiple first pixels PX1 and multiple second pixels PX2. The second pixels PX2 may be disposed adjacent to the second shorter side SS2 of the second display device PA2. At least one of the second pixels PX2 may be disposed adjacent to the second longer side LS2 of the second display device PA2. The first pixels PX1 may be adjacent to the second pixels PX2 and may be disposed adjacent to the second longer side LS2 of the second display device PA2. The second pixels PX2 may be disposed between the first pixels PX1 and the second shorter side SS2 of the second display device PA2.

According to an embodiment of the disclosure, the first pixels PX1 of the second display device PA2 may be disposed in the first row and the second row of the fourth column, respectively. The second pixels PX2 of the second display device PA2 may be disposed in the first row and the second row of the third column, respectively.

In the third boundary area BA3, the third display device PA3 may include multiple first pixels PX1 and a second pixel PX2. The first pixels PX1 may be disposed adjacent to the third longer side LS3 of the third display device PA3. At least one of the first pixels PX1 may be disposed adjacent to the third shorter side SS3 of the third display device PA3. The second pixel PX2 may be disposed adjacent to the third shorter side SS3 of the third display device PA3. The first pixel PX1 may be disposed between the second pixel PX2 and the third longer side LS3 of the third display device PA3.

According to an embodiment of the disclosure, the first pixels PX1 of the third display device PA3 may be disposed in the third row and the fourth row of the first column, and the third row of the second column, respectively. The second pixel PX2 of the third display device PA3 may be disposed in the fourth row of the second column.

In the third boundary area BA3, the fourth display device PA4 may include a first pixel PX1, a third pixel PX3, a fourth pixel PX4 and a fifth pixel PX5.

Referring to FIGS. 10 and 11, the third pixel PX3 may be disposed adjacent to the fourth shorter side SS4 and the fourth longer side LS4 of the fourth display device PA4. The third pixel PX3 may include a single sub-pixel, for example, a third sub-pixel SP3. The third sub-pixel SP3 may emit the third color or green light.

The third sub-pixel SP3 may be disposed at a corner of the third pixel PX3.

According to an embodiment of the disclosure, like the above-described first pixel PX1, the third pixel PX3 may include a first side FS1 parallel to the first direction (x-axis direction) and located on the side indicated by the second direction (y-axis direction), a second side FS2 opposed to the first side FS1, a third side FS3 parallel to the second direction (y-axis direction) and located on the opposite side of the first direction (x-axis direction), and a fourth side FS4 opposed to the third side FS3. The third sub-pixel SP3 may be adjacent to the second side FS2 and the fourth side FS4 of the third pixel PX3. For example, the third sub-pixel SP3 may be disposed adjacent to the lower right hand of the third pixel PX3. According to an embodiment of the disclosure, the third pixel PX3 of the fourth display device PA4 may be disposed in the third column of the third row.

Referring to FIGS. 10 and 12, the fourth pixel PX4 of the fourth display device PA4 may be disposed adjacent to the fourth longer side LS4 of the fourth display device PA4 and the third pixel PX3. According to an embodiment of the disclosure, the fourth pixel PX4 of the fourth display device PA4 may be disposed in the fourth column of the third row.

The fourth pixel PX4 may include multiple sub-pixels SP1 to SP4. For example, the fourth pixel PX4 may include a first sub-pixel SP1, a second sub-pixel SP2, a third sub-pixel SP3, and a fourth sub-pixel SP4. In an embodiment, the fourth pixel PX4 may include a total of four sub-pixels.

The first to fourth sub-pixels SP1 to SP4 may be arranged adjacent to each other and may be arranged parallel to the fourth longer side LS4 of the fourth display device PA4. For example, the first to fourth sub-pixels SP1 to SP4 may be arranged side by side in the first direction (x-axis direction). The first to third sub-pixels SP1 to SP3 may be disposed in the same manner as the first pixel PX1 described above. Specifically, the first to third sub-pixels SP1 to SP3 may be disposed adjacent to the second side FS2 and the fourth side FS4 of the fourth pixel PX4, for example, may be disposed adjacent to (e.g., closer to) the lower right hand of the fourth pixel PX4.

The fourth sub-pixel SP4 may be disposed adjacent to the first sub-pixel SP1 and may be disposed adjacent to the third sub-pixel SP3 of the third pixel PX3. The fourth sub-pixel SP4 may be adjacent to the second side FS2 and the third side FS3 of the fourth pixel PX4. For example, the fourth sub-pixel SP4 may be disposed at the lower left corner of the fourth pixel PX4.

The fourth sub-pixel SP4 may emit light of the same color as any color of the lights emitted from the first to third sub-pixels SP1 to SP3 of the fourth pixel PX4. The fourth sub-pixel SP4 may emit light of a color different from that of the third sub-pixel SP3 of the third pixel PX3. For example, the third sub-pixel SP3 may emit green light while the fourth sub-pixel SP4 may emit blue or red light.

In the third boundary areas BA3, the third pixel PX3 of the fourth display device PA4 requires marginal areas in the first direction (x-axis direction) and the second direction (y-axis direction). The first pixel PX1 of the third display device PA3 described above may have a marginal area equal to the first distance DD1 from the first longer side LS1 of the first display device PA1 in the second direction (y-axis direction). The second pixel PX2 of the second display device PA2 may have a marginal area equal to the second distance DD2 from the first shorter side SS1 of the first display device PA1 in the first direction (x-axis direction). If the third pixel PX3 of the fourth display device PA4 has the same arrangements of sub-pixels as the first pixels PX1 or the second pixels PX2, it cannot have a marginal area in the first direction or the second direction. For this reason, according to this embodiment, the third sub-pixel SP3 may be disposed in the third pixel PX3 to have the margin areas in the first and second directions. Accordingly, there may be obtained the first distance DD1 between the third sub-pixel SP3 and the second longer side LS2 of the second display device PA2 in the second direction, and the second distance DD2 between the third sub-pixel SP3 and the third shorter side SS3 of the third display device PA3.

The third pixel PX3 may include only the third sub-pixel SP3 that emits green light. A pixel can represent full color by emitting light of three colors, i.e., red, green and blue. According to this embodiment, in order to supplement other colors of the third pixel PX3 including only the third sub-pixel SP3, the fourth sub-pixel SP4 may be further disposed in the adjacent fourth pixel PX4. By doing so, light of a color that may not be emitted from the third pixel PX3 can be emitted from the fourth sub-pixel SP4.

Referring to FIGS. 10 and 13, the fifth pixel PX5 of the fourth display device PA4 may be disposed adjacent to the fourth shorter side SS4 of the fourth display device PA4 and the third pixel PX3. According to an embodiment of the disclosure, the fifth pixel PX5 of the fourth display device PA4 may be disposed in the fourth row of the third column.

The fifth pixel PX5 may include multiple sub-pixels SP1 to SP3 and SP5. For example, the fifth pixel PX5 may include a first sub-pixel SP1, a second sub-pixel SP2, a third sub-pixel SP3, and a fifth sub-pixel SP5. In an embodiment, the fifth pixel PX5 may include a total of four sub-pixels.

The first to third sub-pixels SP1 to SP3 and the fifth sub-pixel SP5 may be arranged adjacent to each other and may be arranged parallel to the fourth shorter side SS4 of the fourth display device PA4. For example, the first to third sub-pixels SP1 to SP3 and the fifth sub-pixel SP5 may be arranged side by side in the second direction (y-axis direction). The first to third sub-pixels SP1 to SP3 may be disposed in the same manner as those of the second pixel PX2 described above. Specifically, the first to third sub-pixels SP1 to SP3 may be disposed adjacent to the second side FS2 and the fourth side FS4 of the fifth pixel PX5, for example, may be disposed adjacent to (e.g., closer to) the lower right hand of the fifth pixel PX5.

The fifth sub-pixel SP5 may be disposed adjacent to the first sub-pixel SP1 and may be disposed adjacent to the third sub-pixel SP3 of the third pixel PX3. The fifth sub-pixel SP5 may be disposed adjacent to the first side FS1 and the fourth side FS4 of the fifth pixel PX5. For example, the fifth sub-pixel SP5 may be disposed at the upper right corner of the fifth pixel PX5.

The fifth sub-pixel SP5 may emit light of the same color as any color of the lights emitted from the first to third sub-pixels SP1 to SP3 of the fifth pixel PX5. The fifth sub-pixel SP5 may emit light of a color different from that of the third sub-pixel SP3 of the third pixel PX3, and light of a color different from that of the fourth sub-pixel SP4 of the fourth pixel PX4. For example, the third sub-pixel SP3 may emit green light, the fourth sub-pixel SP4 may emit either blue light or red light, and the fifth sub-pixel SP5 may emit light other than the light emitted from the fourth sub-pixels SP4. In an embodiment, the third sub-pixel SP3 may emit green light, the fourth sub-pixel SP4 may emit blue light, and the fifth sub-pixel SP5 may emit red light.

The third pixel PX3 may include only the third sub-pixel SP3 that emits green light. A pixel can represent full color by emitting light of three colors, i.e., red, green and blue. According to this embodiment, in order to supplement other colors of the third pixel PX3 including only the third sub-pixel SP3, the fourth sub-pixel SP4 may be further disposed in the adjacent fourth pixel PX4 and the fifth sub-pixel SP5 may be further disposed in the adjacent fifth pixel PX5. By doing so, lights of colors that may not be emitted from the third pixel PX3 can be emitted from the fourth sub-pixel SP4 along with the fifth sub-pixel SP4.

In the third boundary area BA3, the first pixel PX1 of the fourth display device PA4 may be disposed adjacent to the fourth pixel PX4 and the fifth pixel PX5. The first pixel PX1 may be disposed on the opposite side of the fourth pixel PX4 in the second direction (y-axis direction), and may be disposed on the side of the fifth pixel PX5 indicated by the first direction (x-axis direction). According to an embodiment of the disclosure, the first pixel PX1 may be disposed in the fourth row of the fourth column.

Referring to FIG. 14, the remaining area RA according to an embodiment may be the area of the display devices PA1 to PA4 other than the first to third boundary areas BA1 to BA3. The remaining area RA may be, for example, the area in each of the display devices PA1 to PA4 that may not be adjacent to the other display devices.

The remaining area RA may include one of multiple first pixels PX1, multiple second pixels PX2, or multiple sixth pixels PX6. As the remaining area RA may not be adjacent to the other display devices, it may be disposed without any margin for a process of attaching the display devices. For example, as shown in FIG. 14, the remaining area RA may include multiple first pixels PX1.

Incidentally, in the tiled display TD according to an embodiment, the third sub-pixel SP3 that emits green light may be disposed at the same location in each of the first to third boundary areas BA1 to BA3 and the remaining area RA. For example, the third sub-pixel SP3 disposed in each of the first to fifth pixels PX1 to PX5 may be disposed at the same location within each pixel.

The third sub-pixel SP3 of the first pixel PX1 (FIG. 8), the third sub-pixel SP3 of the second pixel PX2 (FIG. 9), the third sub-pixel SP3 of the third pixel PX3 (FIG. 11), the third sub-pixel SP3 of the fourth pixel PX4 (FIG. 12), and the third sub-pixel SP3 of the fifth pixel PX5 (FIG. 13) each may be disposed adjacent to the corner where the second side FS2 and the fourth side FS4 of the respective pixel meet. For example, the third sub-pixel SP3 may be disposed adjacent to (e.g., closer to) the lower right hand of the respective pixel.

In the tiled display TD according to an embodiment, the sub-pixels may be arranged differently in different areas. As the sub-pixels may have different arrangements for different areas, such differences may be recognized by a user, and thus the display quality may be deteriorated. In this regard, according to this embodiment, the third sub-pixel SP3 that emits green light, which may be sensitively recognized by the user, may be disposed at the same location in each pixel, thereby preventing that the visibility may be lowered and thus the display quality may be deteriorated.

Figure 15:
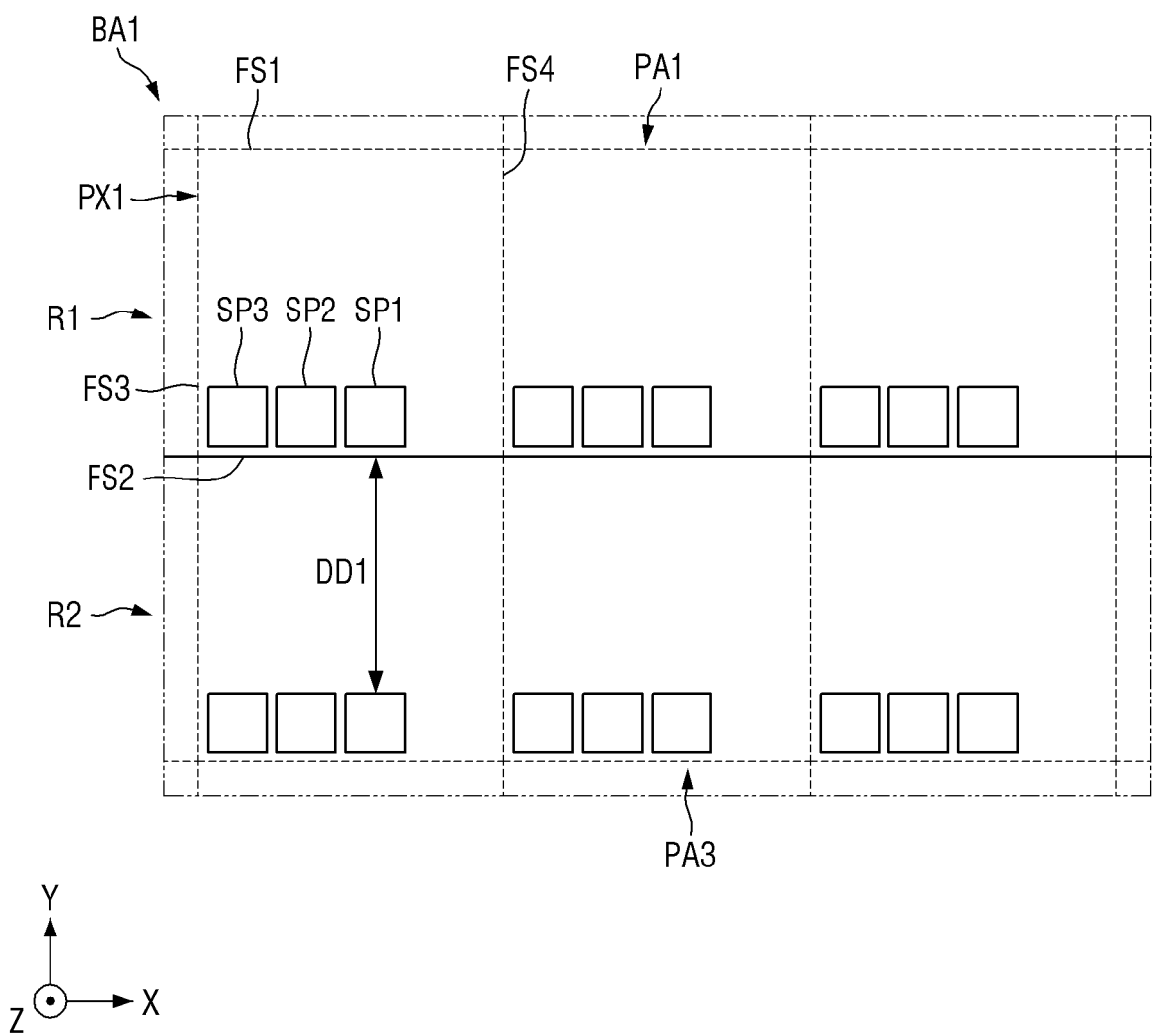
FIG. 15 is a schematic plan view showing an example of a portion of a first boundary area of a tiled display according to another embodiment of the disclosure.
Figure 16:
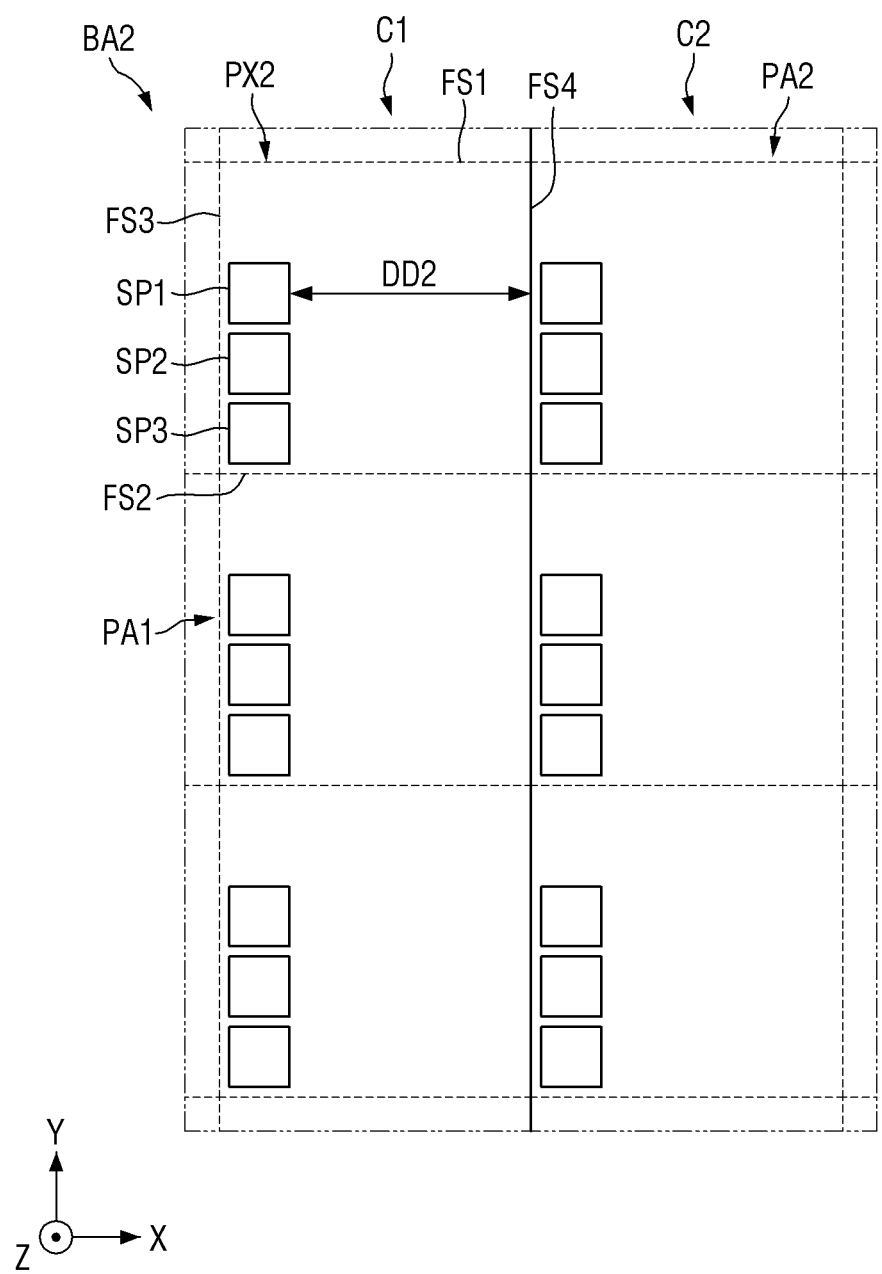
FIG. 16 is a schematic plan view showing an example of a portion of a second boundary area of a tiled display according to an embodiment of the disclosure.
Figure 17:
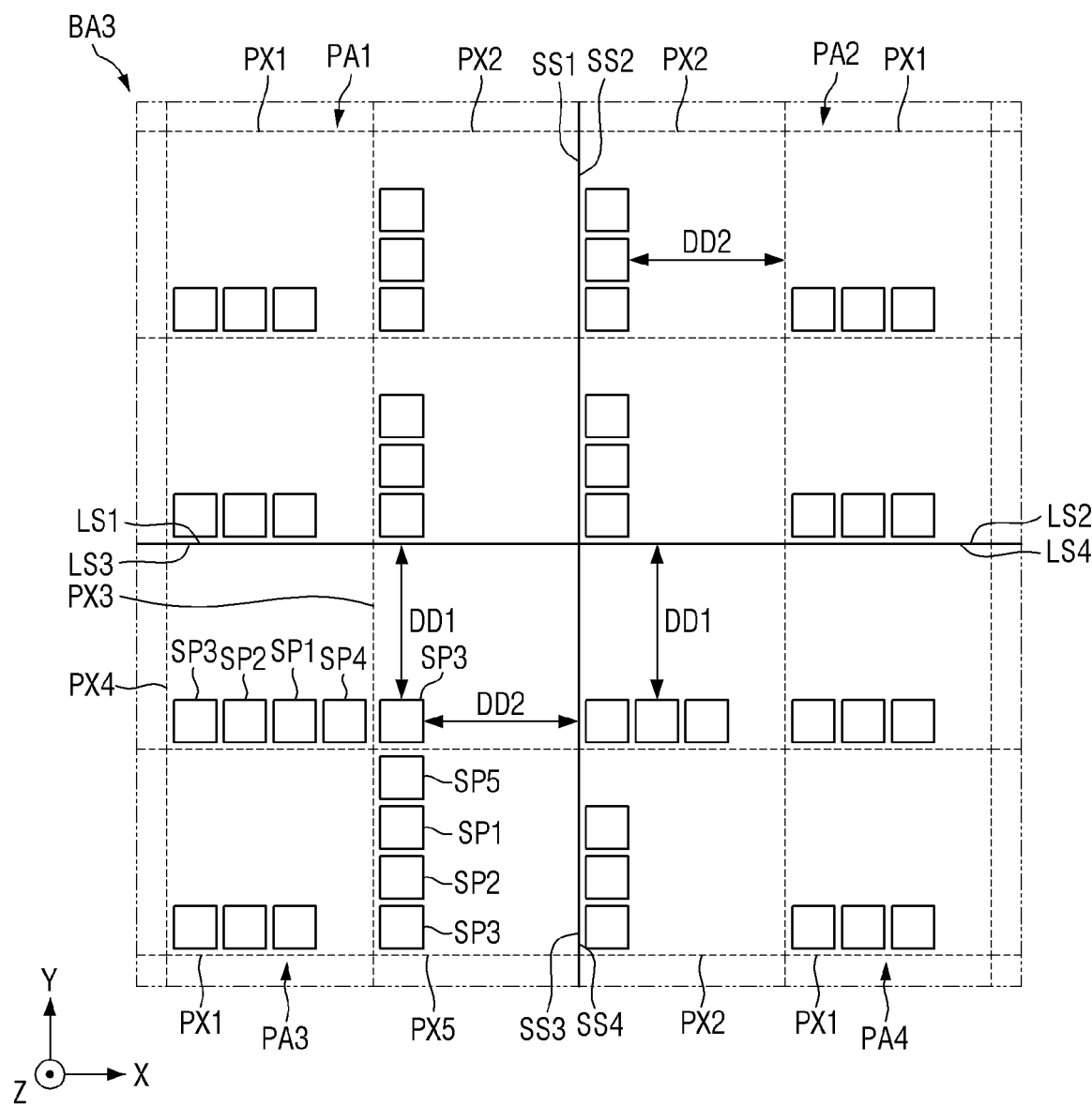
FIG. 17 is a schematic plan view showing an example of a portion of a third boundary area of the tiled display according to an embodiment of the disclosure.
Figure 18:
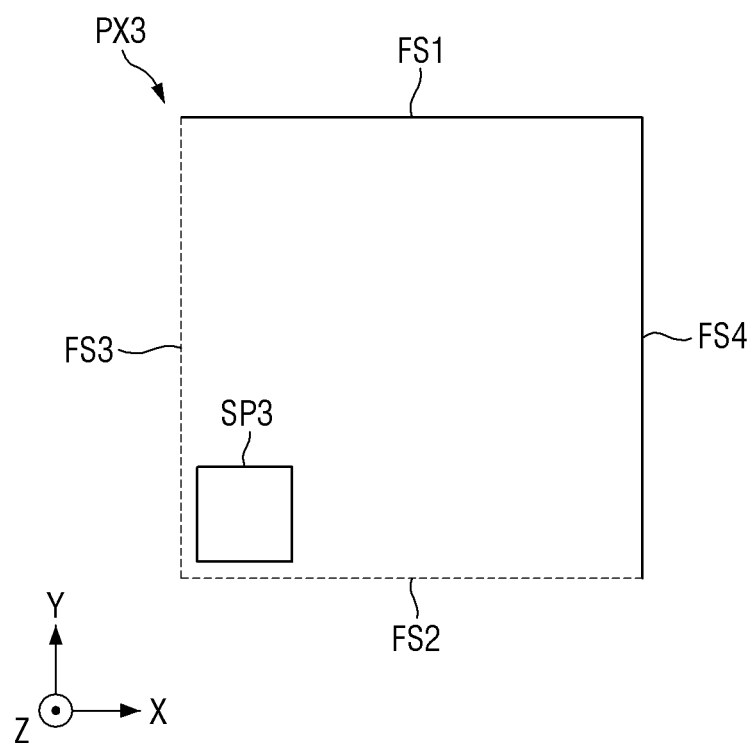
FIG. 18 is a schematic plan view showing a third pixel of the third boundary area of the tiled display according to an embodiment of the disclosure.
Figure 19:
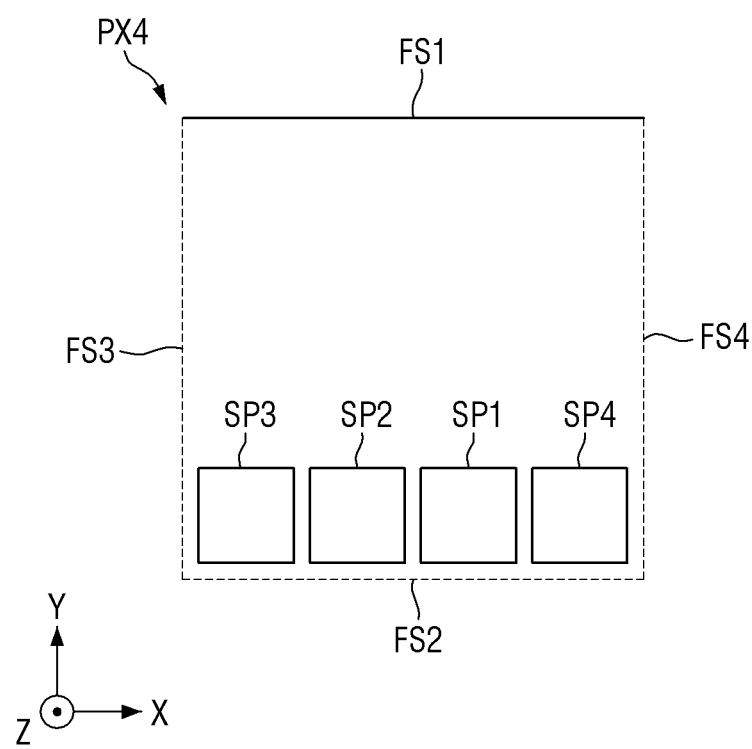
FIG. 19 is a schematic plan view showing a fourth pixel of the third boundary area of the tiled display according to an embodiment of the disclosure.
Figure 20:
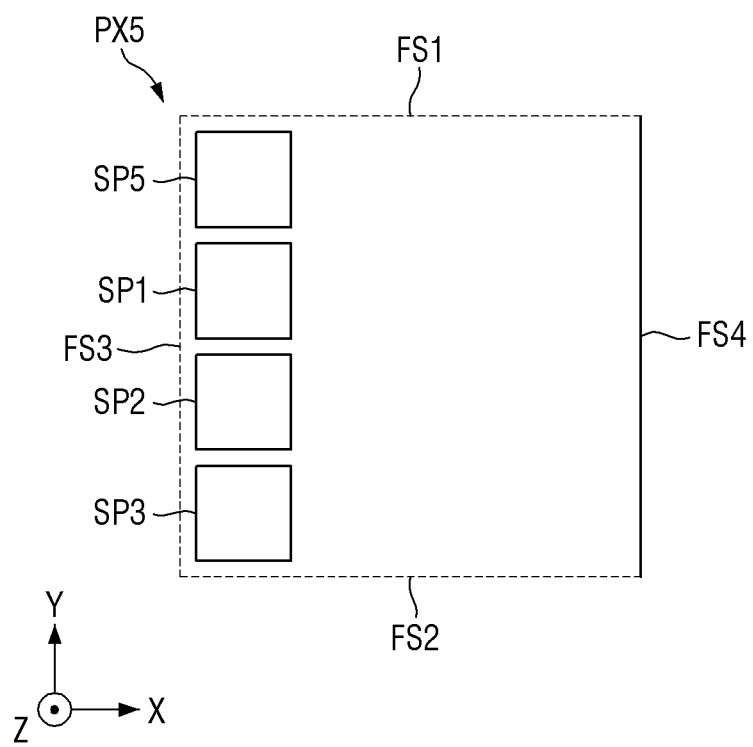
FIG. 20 is a schematic plan view showing a fifth pixel of the third boundary area of the tiled display according to an embodiment of the disclosure.
Figure 21:
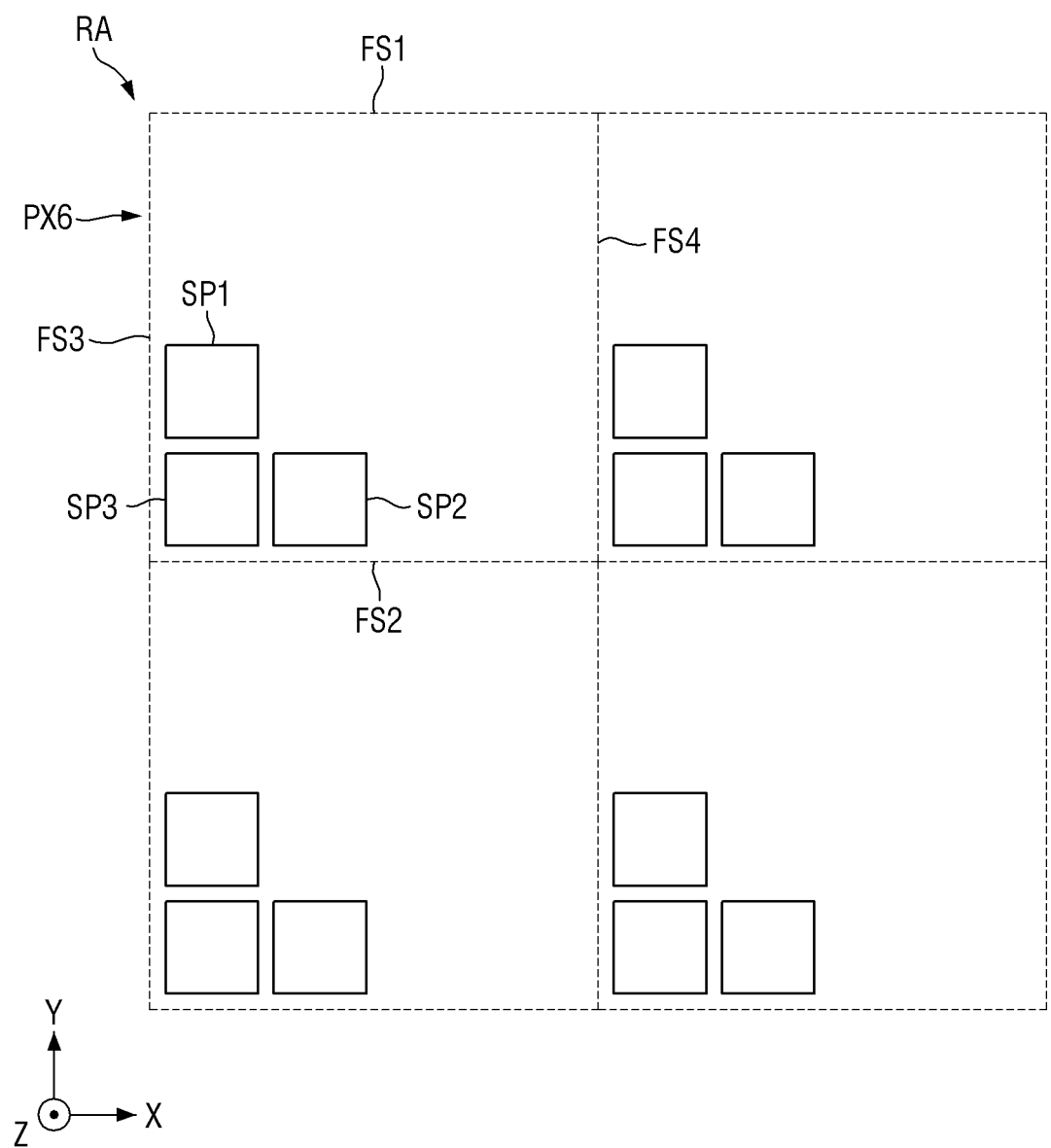
FIG. 21 is a schematic plan view showing a portion of a remaining area of the tiled display according to an embodiment of the disclosure.

FIG. 15 is a schematic plan view showing an example of a portion of a first boundary area of a tiled display according to another embodiment of the disclosure. FIG. 16 is a schematic plan view showing an example of a portion of a second boundary area of a tiled display according to an embodiment of the disclosure. FIG. 17 is a schematic plan view showing an example of a portion of a third boundary area of the tiled display according to an embodiment of the disclosure. FIG. 18 is a schematic plan view showing a third pixel of the third boundary area of the tiled display according to an embodiment of the disclosure. FIG. 19 is a schematic plan view showing a fourth pixel of the third boundary area of the tiled display according to an embodiment of the disclosure. FIG. 20 is a schematic plan view showing a fifth pixel of the third boundary area of the tiled display according to an embodiment of the disclosure. FIG. 21 is a schematic plan view showing a portion of a remaining area of the tiled display according to an embodiment of the disclosure.

The embodiments of FIGS. 15 to 21 may be different from the above-described embodiments shown in FIGS. 8 to 14 in that the arrangements of the first to third sub-pixels in each of the first to sixth pixels PX1 to PX6 may be different. In the following description, the description will focus on the difference and the redundant description will be omitted.

Referring to FIG. 15, the first boundary area BA1 may include multiple first pixels PX1, and the first pixels PX1 may include first to third sub-pixels SP1 to SP3. The first to third sub-pixels SP1 to SP3 may be adjacent to the second side FS2 and the third side FS3 of the first pixel PX1. For example, the first to third sub-pixels SP1 to SP3 may be disposed adjacent to the lower left hand of the first pixel PX1. Unlike the embodiment of FIG. 8, the third sub-pixel SP3 may be disposed at the lower left corner of the first pixel PX1, and the first sub-pixel SP1 may be disposed farthest from the third sub-pixel SP3 in a first direction (x-axis direction). The second sub-pixel SP2 may be disposed between the first sub-pixel SP1 and the third sub-pixel SP3.

The first to third sub-pixels SP1 to SP3 of the first pixels PX1 of the second display device PA2 arranged in the first boundary areas BA1 may be spaced apart from the first longer side LS1 of the first display device PA1 by a first distance DD1. The first to third sub-pixels SP1 to SP3 of each of the first pixels PX1 arranged in the first boundary area BA1 may be gathered adjacent to (e.g., closer to) the corner where the second side FS2 and the third side FS3 of the first pixel PX1 meet, so that the marginal area in the first direction (x-axis direction) that may be equal to the first distance DD1 can be obtained within the first pixel PX1.

Referring to FIG. 16, a second boundary area BA2 may include multiple second pixels PX2, and each of the second pixels PX2 may include first to third sub-pixels SP1 to SP3. The first to third sub-pixels SP1 to SP3 may be adjacent to the second side FS2 and the third side FS3 of the second pixel PX2. For example, the first to third sub-pixels SP1 to SP3 may be disposed adjacent to the lower left hand of the second pixel PX2. The third sub-pixel SP3 may be disposed closest to the lower left corner of the second pixel PX2, and the first sub-pixel SP1 may be disposed farthest from the third sub-pixel SP3 in the second direction (y-axis direction). The second sub-pixel SP2 may be disposed between the first sub-pixel SP1 and the third sub-pixel SP3.

The first to third sub-pixels SP1 to SP3 of the second pixels PX2 of the first display device PA1 arranged in the second boundary areas BA2 may be spaced apart from the second shorter side SS2 of the second display device PA2 by a second distance DD2. The first to third sub-pixels SP1 to SP3 of each of the second pixels PX2 arranged in the second boundary area BA2 may be gathered adjacent to (e.g., closer to) the corner where the second side FS2 and the third side FS3 of the second pixel PX2 meet, so that the marginal area in the first direction (x-axis direction) that may be equal to the second distance DD2 can be obtained within the second pixel PX2.

Referring to FIG. 17, in the third boundary area BA3, the first display device PA1 may include multiple first pixels PX1 and multiple second pixels PX2. The second pixels PX2 may be disposed adjacent to the first shorter side SS1 of the first display device PAL At least one of the second pixels PX2 may be disposed adjacent to the first longer side LS1 of the first display device PAL The first pixels PX1 may be adjacent to the second pixels PX2 and may be disposed adjacent to the first longer side LS1 of the first display device PAL The second pixels PX2 may be disposed between the first pixels PX1 and the first shorter side SS1 of the first display device PA1.

Each of the first pixels PX1 and the second pixels PX2 may include multiple first to third sub-pixels SP1 to SP3. The first to third sub-pixels SP1 to SP3 of the first pixels PX1 may be arranged in the same manner as those of the first pixels PX1 of the first boundary areas BA1 described above. The first to third sub-pixels SP1 to SP3 of the second pixels PX2 may be arranged in the same manner as those of the second pixels PX2 of the second boundary areas BA2 described above.

According to an embodiment of the disclosure, the third boundary area BA3 may include pixels arranged in a 4-by-4 matrix. The first pixels PX1 of the first display device PA1 may be disposed in the first row and the second row of the first column, respectively. The second pixels PX2 of the first display device PA1 may be disposed in the first row and the second row of the second column, respectively.

In the third boundary area BA3, the second display device PA2 may include multiple first pixels PX1 and multiple second pixels PX2. The second pixels PX2 may be disposed adjacent to the second shorter side SS2 of the second display device PA2. At least one of the second pixels PX2 may be disposed adjacent to the second longer side LS2 of the second display device PA2. The first pixels PX1 may be adjacent to the second pixels PX2 and may be disposed adjacent to the second longer side LS2 of the second display device PA2. The second pixels PX2 may be disposed between the first pixels PX1 and the second shorter side SS2 of the second display device PA2.

According to an embodiment of the disclosure, the first pixels PX1 of the second display device PA2 may be disposed in the first row and the second row of the fourth column, respectively. The second pixels PX2 of the second display device PA2 may be disposed in the first row and the second row of the third column, respectively.

In the third boundary area BA3, the third display device PA3 may include a first pixel PX1, a third pixel PX3, a fourth pixel PX4 and a fifth pixel PX5.

Referring to FIGS. 17 and 18, the third pixel PX3 may be disposed adjacent to the fourth shorter side SS3 and the fourth longer side LS3 of the third display device PA3. The third pixel PX3 may include a single sub-pixel, for example, a third sub-pixel SP3. The third sub-pixel SP3 may emit the third color or green light.

The third sub-pixel SP3 may be disposed at a corner of the third pixel PX3. According to an embodiment of the disclosure, like the above-described first pixel PX1, the third sub-pixel SP3 may be adjacent to the second side FS2 and the third side FS3 of the third pixel PX3. For example, the third sub-pixel SP3 may be disposed adjacent to the lower left hand of the third pixel PX3. According to an embodiment of the disclosure, the third pixel PX3 of the third display device PA3 may be disposed in the third row of the second column.

Referring to FIGS. 17 and 19, the fourth pixel PX4 of the third display device PA3 may be disposed adjacent to the third longer side LS3 of the third display device PA3 and the third pixel PX3. According to an embodiment of the disclosure, the fourth pixel PX4 of the third display device PA3 may be disposed in the third row of the first column.

The fourth pixel PX4 may include multiple sub-pixels SP1 to SP4. For example, the fourth pixel PX4 may include a first sub-pixel SP1, a second sub-pixel SP2, a third sub-pixel SP3, and a fourth sub-pixel SP4. In an embodiment, the fourth pixel PX4 may include a total of four sub-pixels.

The first to fourth sub-pixels SP1 to SP4 may be arranged adjacent to each other and may be arranged parallel to the fourth longer side LS4 of the fourth display device PA4. For example, the first to fourth sub-pixels SP1 to SP4 may be arranged side by side in the first direction (x-axis direction). The first to third sub-pixels SP1 to SP3 may be disposed in the same manner as the first pixel PX1 described above. Specifically, the first to third sub-pixels SP1 to SP3 may be disposed adjacent to the second side FS2 and the third side FS3 of the fourth pixel PX4, for example, may be gathered adjacent to (e.g., closer to) the lower left hand of the fourth pixel PX4.

The fourth sub-pixel SP4 may be disposed adjacent to the first sub-pixel SP1 and may be disposed adjacent to the third sub-pixel SP3 of the third pixel PX3. The fourth sub-pixel SP4 may be disposed adjacent to the second side FS2 and the fourth side FS4 of the fourth pixel PX4. For example, the fourth sub-pixel SP4 may be disposed at the lower right corner of the fourth pixel PX4.

The fourth sub-pixel SP4 may emit light of the same color as any color of the lights emitted from the first to third sub-pixels SP1 to SP3 of the fourth pixel PX4. The fourth sub-pixel SP4 may emit light of a color different from that of the third sub-pixel SP3 of the third pixel PX3. For example, the third sub-pixel SP3 may emit green light while the fourth sub-pixel SP4 may emit blue or red light.

For this reason, according to this embodiment, only the third sub-pixel SP3 may be disposed in the third pixel PX3 to have the margin areas in the first and second directions. Accordingly, there may be obtained the first distance DD1 between the third sub-pixel SP3 and the second longer side LS2 of the second display device PA2 in the second direction, and the second distance DD2 between the third sub-pixel SP3 and the fourth shorter side SS4 of the fourth display device PA4.

According to this embodiment, in order to supplement other colors of the third pixel PX3 including only the third sub-pixel SP3, the fourth sub-pixel SP4 may be further disposed in the adjacent fourth pixel PX4. By doing so, light of a color that may not be emitted from the third pixel PX3 can be emitted from the fourth sub-pixel SP4.

Referring to FIGS. 17 and 20, the fifth pixel PX5 of the third display device PA3 may be disposed adjacent to the third shorter side SS3 of the third display device PA3 and the third pixel PX3. According to an embodiment of the disclosure, the fifth pixel PX5 of the third display device PA3 may be disposed in the fourth row of the second column.

The fifth pixel PX5 may include multiple sub-pixels SP1 to SP3 and SP5. For example, the fifth pixel PX5 may include a first sub-pixel SP1, a second sub-pixel SP2, a third sub-pixel SP3, and a fifth sub-pixel SP5. In an embodiment, the fifth pixel PX5 may include a total of four sub-pixels.

The first to third sub-pixels SP1 to SP3 and the fifth sub-pixel SP5 may be arranged adjacent to each other and may be arranged parallel to the third shorter side SS3 of the third display device PA3. For example, the first to third sub-pixels SP1 to SP3 and the fifth sub-pixel SP5 may be arranged side by side in the second direction (y-axis direction). The first to third sub-pixels SP1 to SP3 may be disposed in the same manner as those of the second pixel PX2 described above. Specifically, the first to third sub-pixels SP1 to SP3 may be disposed adjacent to the second side FS2 and the third side FS3 of the fifth pixel PX5, for example, may be disposed adjacent to (e.g., closer to) the lower left hand of the fifth pixel PX5.

The fifth sub-pixel SP5 may be disposed adjacent to the first sub-pixel SP1 and may be disposed adjacent to the third sub-pixel SP3 of the third pixel PX3. The fifth sub-pixel SP5 may be disposed adjacent to the first side FS1 and the third side FS3 of the fifth pixel PX5. For example, the fifth sub-pixel SP5 may be disposed at the upper left corner of the fifth pixel PX5.

The fifth sub-pixel SP5 may emit light of the same color as any color of the lights emitted from the first to third sub-pixels SP1 to SP3 of the fifth pixel PX5. The fifth sub-pixel SP5 may emit light of a color different from that of the third sub-pixel SP3 of the third pixel PX3, and light of a color different from that of the fourth sub-pixel SP4 of the fourth pixel PX4. For example, the third sub-pixel SP3 may emit green light, the fourth sub-pixel SP4 may emit either blue light or red light, and the fifth sub-pixel SP5 may emit light other than the light emitted from the fourth sub-pixels SP4. In an embodiment, the third sub-pixel SP3 may emit green light, the fourth sub-pixel SP4 may emit blue light, and the fifth sub-pixel SP5 may emit red light.

According to this embodiment, in order to supplement other colors of the third pixel PX3 including only the third sub-pixel SP3, the fourth sub-pixel SP4 may be further disposed in the adjacent fourth pixel PX4 and the fifth sub-pixel SP5 may be further disposed in the adjacent fifth pixel PX5. By doing so, lights of colors that may not be emitted from the third pixel PX3 can be emitted from the fourth sub-pixel SP4 along with the fifth sub-pixel SP5.

In the third boundary area BA3, the first pixel PX1 of the third display device PA3 may be disposed adjacent to the fourth pixel PX4 and the fifth pixel PX5. The first pixel PX1 may be disposed on the opposite side of the fourth pixel PX4 in the second direction (y-axis direction), and may be disposed on the opposite side of the fifth pixel PX5 in the first direction (x-axis direction). According to an embodiment of the disclosure, the first pixel PX1 may be disposed in the fourth row of the first column.

Referring back to FIG. 17, in the third boundary area BA3, the fourth display device PA4 may include multiple first pixels PX1 and a second pixel PX2. The first pixels PX1 may be disposed adjacent to the fourth longer side LS4 of the fourth display device PA4. At least one of the first pixels PX1 may be disposed adjacent to the fourth shorter side SS4 of the fourth display device PA4. The second pixel PX2 may be disposed adjacent to the fourth shorter side SS4 of the fourth display device PA4. The first pixel PX1 may be disposed between the second pixel PX2 and the fourth longer side LS4 of the fourth display device PA4.

According to an embodiment of the disclosure, the first pixels PX1 of the fourth display device PA4 may be disposed in the third row of the third column, the third row of the fourth column, and the fourth row of the fourth column, respectively. The second pixel PX2 of the fourth display device PA4 may be disposed in the fourth row of the third column.

Referring to FIG. 21, the remaining area RA according to another embodiment may include multiple of sixth pixels PX6. As the remaining area RA may not be adjacent to the other display devices, it may be disposed without any margin for a process of attaching the display devices. In each of the sixth pixels PX6, the first to third sub-pixels SP1 to SP3 may be arranged in a PenTile™ pattern.

Specifically, like the above-described first pixel PX1, the sixth pixel PX6 may include a first side FS1 parallel to the first direction (x-axis direction) and located on the side indicated by the second direction (y-axis direction), a second side FS2 opposed to the first side FS1, a third side FS3 parallel to the second direction (y-axis direction) and located on the opposite side of the first direction (x-axis direction), and a fourth side FS4 opposed to the third side FS3. The first to third sub-pixels SP1 to SP3 may be adjacent to the second side FS2 and the third side FS3 of the sixth pixel PX6. For example, the first to third sub-pixels SP1 to SP3 may be disposed adjacent to the lower left hand of the sixth pixel PX6.

Incidentally, in the tiled display TD according to another embodiment, the third sub-pixel SP3 that emits green light may be disposed at the same location in each of the first to third boundary areas BA1 to BA3 and the remaining area RA. For example, the third sub-pixel SP3 disposed in each of the first to sixth pixels PX1 to PX6 all may be disposed at the same location within each pixel.

The third sub-pixel SP3 of the first pixel PX1 (FIG. 15), the third sub-pixel SP3 of the second pixel PX2 (FIG. 16), the third sub-pixel SP3 of the third pixel PX3 (FIG. 18), the third sub-pixel SP3 of the fourth pixel PX4 (FIG. 19), the third sub-pixel SP3 of the fifth pixel PX5 (FIG. 20) and the third sub-pixel SP3 of the six pixel PX6 (FIG. 21) each may be disposed adjacent to the corner where the second side FS2 and the third side FS3 of the respective pixel meet. For example, the third sub-pixel SP3 may be disposed adjacent to (e.g., closer to) the lower left hand of the respective pixel.

In the tiled display TD according to an embodiment, the sub-pixels may be arranged differently in different areas. As the sub-pixels have different arrangements for different areas, such differences may be recognized by a user, and thus the display quality may be deteriorated. In this regard, according to this embodiment, the third sub-pixel SP3 that emits green light, which may be sensitively recognized by the user, may be disposed at the same location in each pixel, thereby preventing that the visibility may be lowered and thus the display quality may be deteriorated.

Although not shown in the drawings, the arrangements of the first to third sub-pixels SP1 to SP3 of the sixth pixels PX6 in the remaining area RA are not limited by the above-described embodiments though the third sub-pixels SP3 of the other pixels may have the same arrangement.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:
1. A tiled display comprising:
a plurality of display devices adjacent to one another and each comprising first pixels and second pixels;

a first boundary area where longer sides of at least two of the plurality of display devices are adjacent to each other; and a second boundary area where shorter sides of at least two of the plurality of display devices are adjacent to each other, wherein each of the first pixels and the second pixels comprises sub-pixels, the first pixels are disposed in the first boundary area such that each of the sub-pixels of the first pixels are parallel to the longer sides of the plurality of display devices, the second pixels are disposed in the second boundary area such that each of the sub-pixels of the second pixels are parallel to the shorter sides of the plurality of display devices, an arrangement of the sub-pixels in each of the first pixels is different from an arrangement of the sub-pixels in each of the second pixels, and in one of the plurality of display devices, a minimum distance between each of the sub-pixels of the first pixel adjacent to the longer side and the longer side is different from a minimum distance between each of the sub-pixels of the second pixel adjacent to the shorter side and the shorter side, wherein the first boundary area is composed of the first pixels, and the second boundary area is composed of the second pixels.

2. The tiled display of claim 1, wherein each of the sub-pixels of each of the first pixels are adjacent to a corner of each of the first pixels where a first side of each of the first pixels and a second side of each of the first pixels meet, and the first side of each of the first pixels is parallel to the longer sides of the plurality of display devices and the second side of each of the first pixels is parallel to the shorter sides of the plurality of display devices, each of the first pixels includes a third side opposite the first side, each of the sub-pixels of each of the first pixels are closer to the first side than the third side.

3. The tiled display of claim 2, wherein the sub-pixels of each of the second pixels is adjacent to a corner of each of the second pixels where a first side of each of the second pixels and a second side of each of the second pixels meet, and the first side of each of the second pixels is parallel to the longer sides of the plurality of display devices and the second side of each of the second pixels is parallel to the shorter sides of the plurality of display devices, each of the second pixels includes a third side opposite the second side, the sub-pixels of each of the second pixels is closer to the second side than the third side.

4. The tiled display of claim 1, wherein the sub-pixels of each of the first pixels and the second pixels consists of a first sub-pixel, a second sub-pixel, and a third sub-pixel.

5. The tiled display of claim 4, wherein the third sub-pixel of each of the first pixels and the second pixels emits green light and is disposed at a same location in each of the first pixels and the second pixels.

6. The tile display of claim 1, wherein each of the sub-pixels of each of the first pixels in some of the plurality of display devices are spaced apart from a longer side of an adjacent one of the plurality of display devices by a first distance.

7. The tile display of claim 1, wherein each of the sub-pixels of each of the second pixels in some of the plurality of display devices are spaced apart from a shorter side of another adjacent one of the plurality of display devices by a second distance.

8. The tiled display of claim 1, further comprising a third boundary area where corners of the plurality of display devices meet, wherein the third boundary area comprises a third pixel, a fourth pixel and a fifth pixel disposed adjacent to one another, and each of the third pixel, the fourth pixel, and the fifth pixel comprises at least one of a first sub-pixel, a second sub-pixel, and a third sub-pixel.

9. The tiled display of claim 8, wherein the third sub-pixel of the third pixel emits green light, the third sub-pixel being an only sub-pixel in the third pixel, a remainder of an area of the third pixel other than the third sub-pixel is occupied by a marginal area that is absent of any light-emitting areas of any sub-pixels, the third sub-pixel is disposed adjacent to a corner of the third pixel where a first side of the third pixel and a second side of the third pixel meet, and the first side is parallel to the longer sides of the plurality of display devices and the second side is parallel to the shorter sides of the plurality of display devices.

10. The tile display of claim 9, wherein the third sub-pixel of the third pixel is spaced apart from a third side of the third pixel by a first distance, and is spaced apart from a fourth side of the third pixel by a second distance, and the third side is opposite the first side, the fourth side is opposite the second side, and the first distance and the second distance correspond to a marginal area absent of any light emitting areas of any sub-pixels.

11. The tiled display of claim 9, wherein the fourth pixel is disposed adjacent to the third pixel parallel to the longer sides of the plurality of display devices, and comprises a plurality of sub-pixels arranged in a direction parallel to the longer sides of the plurality of display devices from the third sub-pixel of the third pixel, the plurality of sub-pixels comprise the first sub-pixel, the second sub-pixel, the third sub-pixel, and a fourth sub-pixel, and the fourth sub-pixel and one of the first sub-pixel, the second-sub-pixel, and the third sub-pixel emit light of a same color.

12. The tiled display of claim 11, wherein the fourth sub-pixel of the fourth pixel is adjacent to the third sub-pixel of the third pixel, and emits light of a different color from a color of the third sub-pixel of the third pixel.

13. The tiled display of claim 12, wherein the fifth pixel is disposed adjacent to the third pixel parallel to the shorter sides of the plurality of display devices, and comprises a plurality of sub-pixels arranged in a direction parallel to the shorter sides of the plurality of display devices extending from the third sub-pixel of the third pixel, the plurality of sub-pixels comprise the first sub-pixel, the second sub-pixel, the third sub-pixel, and a fifth sub-pixel, and the fifth sub-pixel and one of the first sub-pixel, the second sub-pixel, and the third sub-pixel emit light of a same color.

14. The tiled display of claim 13, wherein
the fifth sub-pixel of the fifth pixel is adjacent to the third sub-pixel of the third pixel, and emits light of a different color from a color of the third sub-pixel of the third pixel,
the fifth sub-pixel emits light of one of the colors of the lights emitted from the first sub-pixel, the second sub-pixel, and the third sub-pixel, and
the light of fifth sub-pixel has a color different from the colors of the lights emitted from the third sub-pixel of the third pixel and the fourth sub-pixel.

15. The tiled display of claim 14, wherein the third sub-pixel of each of the third pixel, the fourth pixel and the fifth pixel is disposed at a same location in each of the third pixel, the fourth pixel, and the fifth pixel.

16. A tiled display comprising:
a plurality of display devices each comprising first pixels and second pixels;
a first boundary area where longer sides of at least two of the plurality of display devices are adjacent to each other;
a second boundary area where shorter sides of at least two of the plurality of display devices are adjacent to each other; and
a third boundary area where corners of the plurality of display devices are adjacent to each other, wherein
one of the plurality of display devices comprises a third pixel, a fourth pixel and a fifth pixel overlapping the third boundary area and adjacent to each other,
each of the third pixel, the fourth pixel and the fifth pixel comprises at least one of a first sub-pixel, a second sub-pixel, and a third sub-pixel,
the third pixel consists of the third sub-pixel,
the third sub-pixel is disposed adjacent to a corner of the third pixel where a first side of the third pixel and a second side of the third pixel meet,
the first side is parallel to the longer sides of the plurality of display devices and the second side is parallel to the shorter sides of the plurality of display devices,
at least one of the sub-pixels of the fourth pixel is arranged parallel to the longer sides of the plurality of display devices from the third sub-pixel of the third pixel,
at least one of the sub-pixels of the fifth pixel is arranged parallel to the shorter sides of the plurality of display devices from the third sub-pixel of the third pixel,
an arrangement of the sub-pixels in each of the first pixels is different from an arrangement of the sub-pixels in each of the second pixels,
each of the sub-pixels of the first pixels are parallel to the longer sides of the plurality of display devices,
each of the sub-pixels of the second pixels are parallel to the shorter sides of the plurality of display devices,
in one of the plurality of display devices, a minimum distance between each of the sub-pixels of the first pixel adjacent to the longer side and the longer side is different from a minimum distance between each of the sub-pixels of the second pixel adjacent to the shorter side and the shorter side,
the first boundary area is composed of the first pixels, and
the second boundary area is composed of the second pixels.

17. The tiled display of claim 16, wherein
the at least one sub-pixel of the fourth pixel comprises the first sub-pixel, the second sub-pixel, the third sub-pixel, and a fourth sub-pixel,
the fourth sub-pixel and one of the first sub-pixel, the second sub-pixel, and the third sub-pixel emit light of a same color, and
the fourth sub-pixel emits light of a different color from a color of the third sub-pixel of the third pixel.

18. The tiled display of claim 17, wherein
the at least one sub-pixel of the fifth pixel comprises the first sub-pixel, the second sub-pixel, the third sub-pixel and a fifth sub-pixel, and
the fifth sub-pixel emits light and one of the first sub-pixel, the second sub-pixel, and the third sub-pixel emit light of a same color, and
the fifth sub-pixel emits light of a different color from a color of the third sub-pixel of the third pixel and the fourth sub-pixel of the fourth pixel.

19. The tiled display of claim 18, wherein
the first pixels are disposed in the first boundary area,
the second pixels are disposed in the second boundary area,
each of the first and second pixels comprises the first sub-pixel, the second sub-pixel and the third sub-pixel, and a marginal area corresponding to an area absent of any light emitting areas of any sub-pixels,
the third sub-pixel of each of the first pixels is disposed adjacent to a corner of each of the first pixels where a first side of each of the first pixels and a second side of each of the first pixels meet,
the first side of each of the first pixels is parallel to the longer sides of the plurality of display devices and the second side of each of the first pixels is parallel to the shorter sides of the plurality of display devices,
the third sub-pixel of each of the second pixels is disposed adjacent to a corner of each of the second pixels where a first side of each of the second pixels and a second side of each of the second pixels meet, and
the first side of each of the second pixels is parallel to the longer sides of the plurality of display devices and the second side of each of the second pixels is parallel to the shorter sides of the plurality of display devices.

20. The tiled display of claim 19, wherein the third sub-pixel of each of the first pixels, the second pixels, the third pixel, the fourth pixel, and the fifth pixel is disposed at a same location in each of the first pixels, the second pixels, the third pixel, the fourth pixel, and the fifth pixel.

* * * * *